(12) United States Patent
Maekawa

(10) Patent No.: US 8,525,249 B2
(45) Date of Patent: Sep. 3, 2013

(54) SEMICONDUCTOR MEMORY DEVICE AND METHOD OF FABRICATING THE SAME

(75) Inventor: Hideaki Maekawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/301,136

(22) Filed: Nov. 21, 2011

(65) Prior Publication Data
US 2012/0061742 A1    Mar. 15, 2012

Related U.S. Application Data

(60) Continuation of application No. 13/081,248, filed on Apr. 6, 2011, now Pat. No. 8,076,205, which is a division of application No. 12/108,101, filed on Apr. 23, 2008, now Pat. No. 7,948,021.

(30) Foreign Application Priority Data

Apr. 27, 2007 (JP) ................................. 2007-120067

(51) Int. Cl.
*H01L 29/788* (2006.01)

(52) U.S. Cl.
USPC ........................................................ 257/316

(58) Field of Classification Search
USPC ................................. 257/314–316, 506, E29.3
See application file for complete search history.

(56) References Cited

U.S. PATENT DOCUMENTS

| | | | |
|---|---|---|---|
| 6,469,339 B1 * | 10/2002 | Onakado et al. | 257/315 |
| 6,720,612 B2 * | 4/2004 | Takeuchi et al. | 257/315 |
| 6,933,194 B2 * | 8/2005 | Narita et al. | 438/257 |
| 7,067,872 B2 * | 6/2006 | Ichige et al. | 257/315 |
| 7,569,465 B2 * | 8/2009 | Chen et al. | 438/588 |
| 7,573,092 B2 * | 8/2009 | Matsui et al. | 257/316 |
| 7,615,819 B2 * | 11/2009 | Nishimura | 257/314 |
| 7,683,421 B2 * | 3/2010 | Buh et al. | 257/314 |
| 7,705,392 B2 * | 4/2010 | Yonemochi et al. | 257/315 |
| 7,786,524 B2 | 8/2010 | Hazama | |

(Continued)

FOREIGN PATENT DOCUMENTS

| JP | 2006-114925 | 4/2006 |
|---|---|---|
| JP | 2006-286697 | 10/2006 |

(Continued)

OTHER PUBLICATIONS

Office Action issued Feb. 26, 2013, in Japanese Patent Application No. 2008-115897, (with English-language Translation).

*Primary Examiner* — Olik Chaudhur
*Assistant Examiner* — Michele Fan
(74) *Attorney, Agent, or Firm* — Oblon, Spivak, McClelland, Maier & Neustadt, L.L.P.

(57) ABSTRACT

A semiconductor memory includes a memory cell array area provided with first and second memory cells and having a first active area and a first element isolation area constituting a line & space structure, and having a floating gate electrode and a control gate electrode in the first active area, a word line contact area adjacent to the memory cell array area and having a second active area, first and second word lines with a metal silicide structure, functioning respectively as the control gate electrodes of the first and second memory cells and arranged to straddle the memory cell array area and the word line contact area. A dummy gate electrode is arranged just below the first and second word lines in the second active area.

8 Claims, 28 Drawing Sheets

(56) References Cited

U.S. PATENT DOCUMENTS

| | | |
|---|---|---|
| 7,884,414 B2 | 2/2011 | Watanabe |
| 7,884,415 B2 * | 2/2011 | Nagano ......................... 257/316 |
| 7,977,190 B2 | 7/2011 | Aritome |
| 2002/0030223 A1 * | 3/2002 | Narita et al. .................. 257/314 |
| 2002/0036317 A1 * | 3/2002 | Matsui et al. ................. 257/315 |
| 2003/0151069 A1 * | 8/2003 | Sugimae et al. .............. 257/200 |
| 2006/0001073 A1 * | 1/2006 | Chen et al. .................... 257/314 |
| 2006/0180846 A1 * | 8/2006 | Takaishi ........................ 257/314 |
| 2007/0132007 A1 * | 6/2007 | Kamigaichi et al. .......... 257/316 |
| 2007/0202647 A1 * | 8/2007 | Mariani et al. ................ 438/257 |
| 2010/0155814 A1 | 6/2010 | Sato et al. |
| 2010/0184275 A1 | 7/2010 | Takeuchi et al. |

FOREIGN PATENT DOCUMENTS

| | | |
|---|---|---|
| JP | 2006-339446 | 12/2006 |
| JP | 2007-49111 | 2/2007 |
| JP | 2007-73887 | 3/2007 |

* cited by examiner

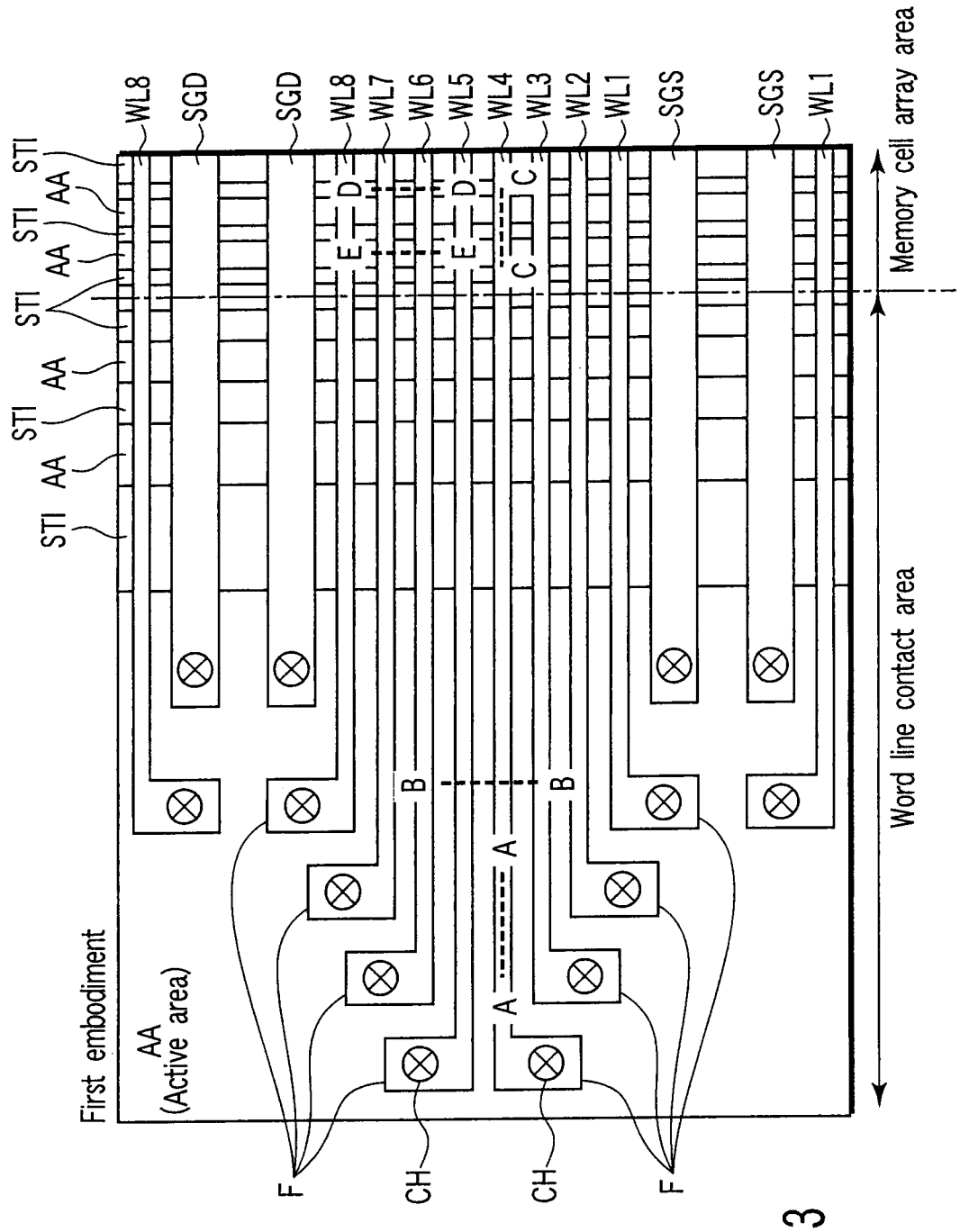
F I G. 3

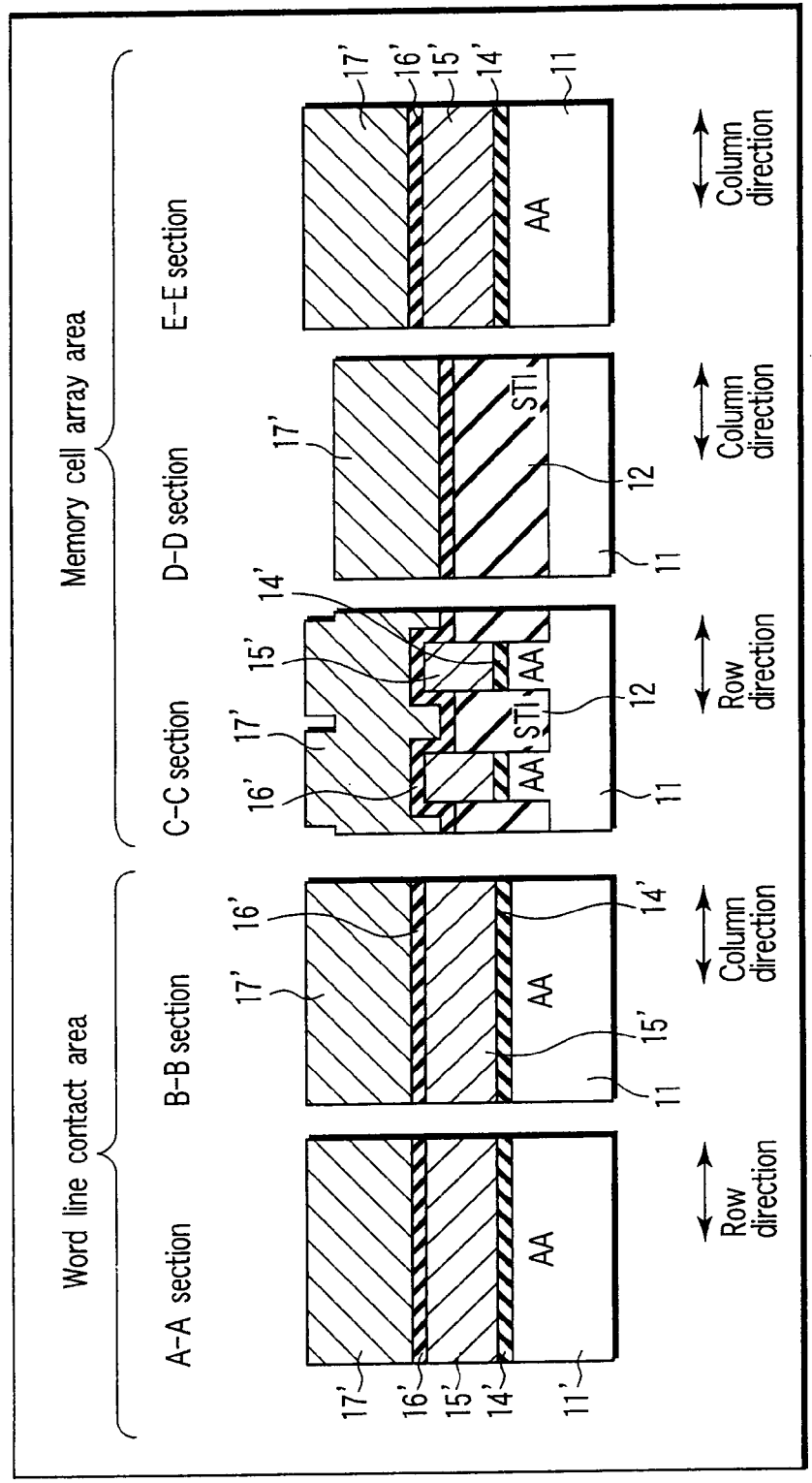
F I G. 6

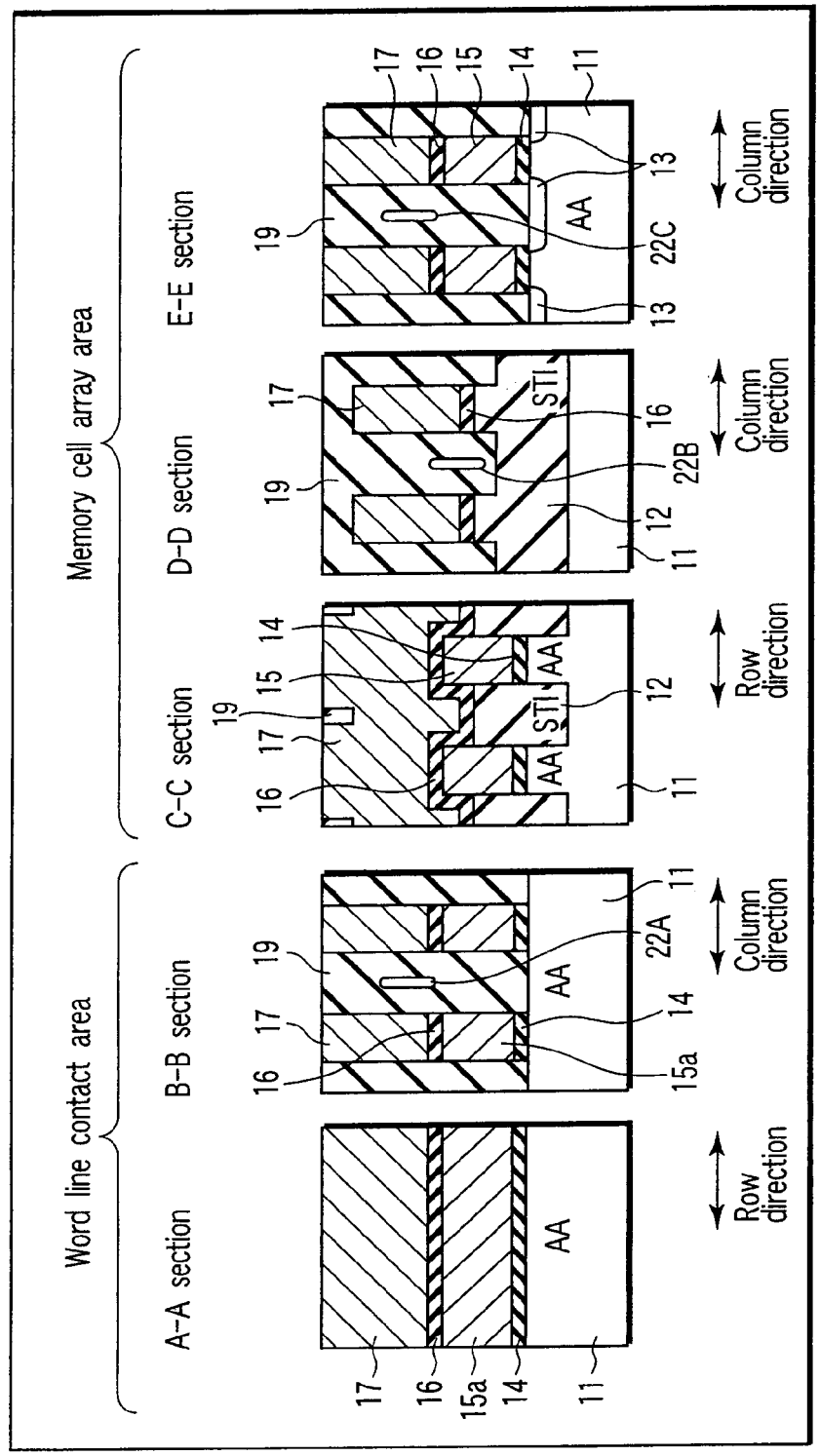
F I G. 9

B1: Void
I: Admission port of dissolved liquid

F I G. 15    B2: Void upper portion is opened

B2:B2: Void upper portion is opened
o : Opening

SEMICONDUCTOR MEMORY DEVICE AND METHOD OF FABRICATING THE SAME

CROSS-REFERENCE TO RELATED APPLICATIONS

This application is a continuation of U.S. application Ser. No. 13/081,248 filed Apr. 6, 2011, and is based upon and claims the benefit of priority from prior Japanese Patent Application No. 2007-120067, filed Apr. 27, 2007, the entire contents of each of which are incorporated herein by reference.

BACKGROUND OF THE INVENTION

1. Field of the Invention

The present invention relates to a base structure of an end area of a word line of a semiconductor memory device.

2. Description of the Related Art

In recent years, in a semiconductor memory device such as a NAND type nonvolatile semiconductor memory device, a space between adjacent word lines (control gate lines) having a line & space structure has become narrow in accordance with the increase in capacity. For this reason, the space between the word lines is not completely filled with insulating materials, so that a void is easily formed in the space between the word lines. In some cases, the void extends to an end area of the word line along the word line.

The end area of the word line has a structure in which the distance between the word lines broadens in order to secure an area for providing each contact hole to the word lines.

For instance, a tip of each word line shifts little by little in an extending direction of the word line, and a pattern of the end area of the word line, as a whole, results in a single-edged shape or a double-edged shape. In addition, a fringe is formed at the end area of the word line.

For this reason, in some cases, an opening is formed on the void in the end area of the word line.

On the other hand, conventionally, in the NAND type or NOR type nonvolatile memory device, low resistance of the word line is attained by constituting an upper portion of the word line with tungsten silicide (WSi), however, in recent years, for further low resistance, for instance, employment of the silicide structure by using cobalt is started (for instance, refer to Jpn. Pat. Appln. KOKAI Publication No. 2007-73887).

Formation of the silicide structure by using cobalt uses a process in which, unlike the conventional formation of tungsten silicide, cobalt metal is deposited on a conductive polysilicon film, silicide is formed by reacting the cobalt metal with the polysilicon film by heat treatment, and unreacted cobalt metal is removed by wet etching.

Here, when the opening is formed in the void, dissolved liquid of metal silicide generated at the time of wet etching flows into the void via the opening, and remains in the void.

The dissolved liquid of the remaining metal silicide in the void becomes a metal ion and moves in an insulating film when high voltage is applied between two word lines which sandwich the dissolved liquid therebetween, thereby causing a short-circuit between these two word lines.

Therefore, in order to improve the reliability of the semiconductor memory device, a new technique for preventing such phenomenon must be developed.

BRIEF SUMMARY OF THE INVENTION

A semiconductor memory device according to an aspect of the present invention comprises a memory cell array area provided with first and second memory cells and having a first active area and a first element isolation area constituting a line & space structure, and having a floating gate electrode and a control gate electrode in the first active area, a word line contact area adjacent to the memory cell array area and having a second active area, first and second word lines with a metal silicide structure, functioning respectively as the control gate electrodes of the first and second memory cells and arranged to straddle the memory cell array area and the word line contact area, first and second contact holes provided respectively corresponding to the first and second word lines in the word line contact area, and a word line driver connected to one end of each of the first and second word lines via the first and second contact holes. Within the second active area, a dummy gate electrode is arranged just below the first and second word lines.

A semiconductor memory device according to an aspect of the present invention, including a first region and a second region located adjacent to the first region, comprising a semiconductor substrate including a first element isolation area extending to a first direction in the first region, a first active area sectionalized by the first element isolation area in the first region, a second element isolation area extending to the first direction in the second region, and a second active area sectionalized by the second element isolation area in the second region, a plurality of word lines extending from the first region to the second region, located parallel to each other and located along a second direction perpendicular to the first direction, each word line including a polysilicon film and a metal silicide film formed on the polysilicon film, a floating gate electrode formed between the first active area and the word lines, a dummy gate electrode formed between the second active area and the word lines, a first insulating film formed between the word lines and formed above the first active area, the second active area, the first element isolation area and the second element isolation area, including an upper portion located lower than an upper surface of the word line and higher than the a lower surface of the word line, the upper portion including a recess in the first and the second active area, and a second insulating film formed on the first insulating film.

A method of fabricating a semiconductor memory device according to an aspect of the present invention, including a semiconductor substrate having a first region and a second region located adjacent to the first region, and a first element isolation area extending to a predetermined direction in the first region, a first active area sectionalized by the first element isolation area in the first region, a second element isolation area extending to the predetermined direction in the second region, and a second active area sectionalized by the second element isolation area in the second region, comprising, forming a gate insulating film on the semiconductor substrate in the active area of the first region and the second region, forming a first polysilicon film on the gate insulating film, forming an inter-gate insulating film on the first polysilicon film, forming a second polysilicon film on the inter-gate insulating film, etching the first and the second polysilicon films and the inter-gate insulating film so as to form first gate electrodes in the first region and second gate electrode in the second region, each first gate electrode including a floating gate electrode, the inter-gate insulating film and the control gate electrode, and each second gate electrode including a dummy gate electrode, the inter-gate insulating film and the control gate electrode extending from the first region, filling a first insulating film between the first gate electrodes in the first region and between the second gate electrodes in the second region, the first insulating film including a void in the active area and the element isolation area of the first and the second regions, a position of the void formed in the active area being higher than a position of the void formed in the element isolation area, etching the first insulating film so as to expose an upper side portion of the control gate electrode, forming a metal silicide film on the second polysilicon film, and forming a second insulating film on the first insulating film, wherein an upper portion of the void formed in the active area being opened by the first insulating film etching step.

BRIEF DESCRIPTION OF THE SEVERAL VIEWS OF THE DRAWINGS

FIG. 3 is a plan view showing a layout of a first embodiment;

FIG. 6 is a cross sectional view showing one process of the manufacturing method;

FIG. 9 is a cross sectional view showing one process of the manufacturing method;

DETAILED DESCRIPTION OF THE INVENTION

A semiconductor memory device of an aspect of the present invention will be described below in detail with reference to the accompanying drawings.

1. Outline

In the present invention, in a semiconductor memory device having a word line of a metal silicide structure, dissolved liquid of the metal silicide is prevented from remaining at a space between the word lines by arranging an active area just below the word lines in a word line contact area.

Figure 1:
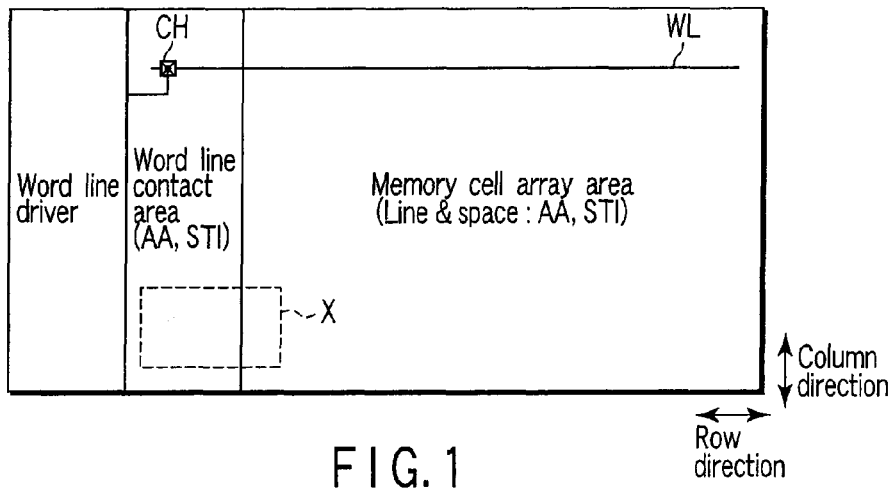
FIG. 1 is a view explaining an outline of the present invention.
Figure 2:
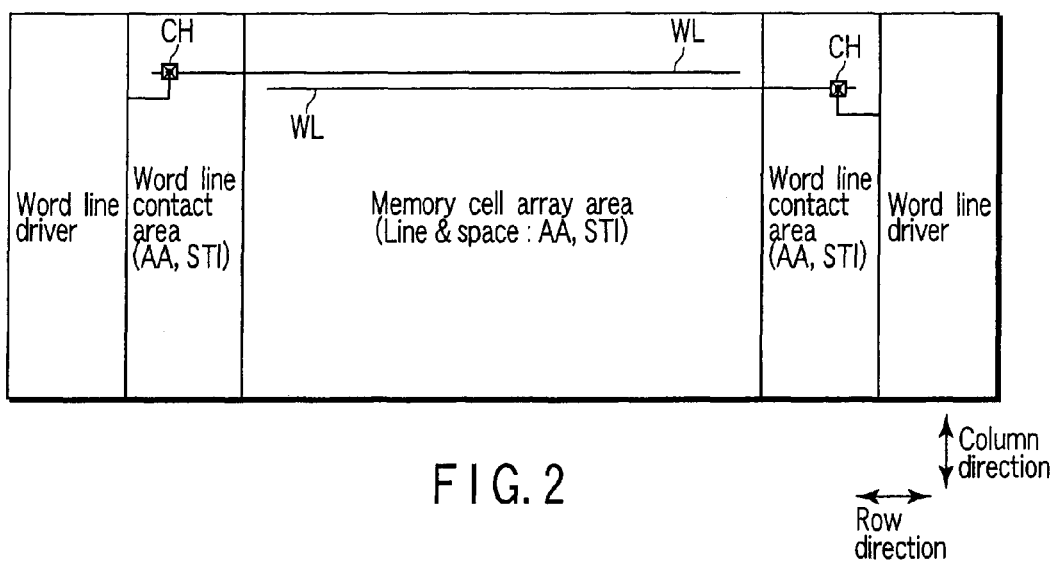
FIG. 2 is a view explaining an outline of the present invention.

That is, as shown in FIGS. 1 and 2, a feature of the present invention is to arrange an active area AA in the word line contact area. The word line contact area may include only the active area AA, or may include both the active area AA and an element isolation insulating layer (element isolation area) STI.

Specifically, an active area different from an active area constituting the line & space structure is arranged just below a word line WL in the word line contact area. In addition, the active area constituting the line & space structure and the element isolation area are arranged just below the word line WL, from a boundary between a memory cell array area and the word line contact area, to the tip of the word line WL in the word line contact area.

Here, as shown in FIGS. 1 and 2, the word line contact area is an area in which a contact hole CH is provided for connecting a word line driver to one end of the word line WL. In addition, the active area AA is an area other than the element isolation area in which the element isolation insulating layer STI is formed.

2. Principle

The situation in which the void is easily formed similarly appears in another area, for instance, a memory cell array area, in addition to the word line contact area.

Accordingly, when inspecting the void generated at a space between a plurality of word lines in the memory cell array area, found is the phenomenon in which the void on the active area is formed on a position higher than the void on the element isolation insulating layer.

In this case, assuming that an upper portion of the void on the active area be opened, it can be easily understood that even though the upper portion of the void on the element isolation insulating layer is not opened, the both communicate with each other in the insulating film, and therefore, regarding all the voids along the word line, the upper portion of the voids result in a state of being opened regularly.

Therefore, if the principle is applied to a base structure of the plurality of word lines in the word line contact area, even though the dissolved liquid of the metal silicide flows into the void, the dissolved liquid of the metal silicide flows out externally from the opening, so that the liquid does not remain in the void since the upper portion of the void is opened.

Note that it is not necessary for the opening to the void to be regular.

Here, if the void between the word lines is filled with the insulating film, the void does not remain as the final structure, and in addition, if the insulating film is formed again on the void, it is difficult to discriminate whether or not the upper portion of the void is opened.

Therefore, the present invention proposes the base structure of an end area of the word line in which the dissolved liquid of the metal silicide does not remain on the space between the word lines, by opening the upper portion of the void in the course of a manufacturing process, even though the void is formed on the space between the word lines.

That is, in the present invention, as described in the above outline, the active area is also arranged just below the word line in the word line contact area.

Since the void on the active area is formed at a position higher than the void on the element isolation insulating layer, from the above described principle, the problem of the present invention can be solved.

3. Embodiments

Embodiments of the present invention will be described with a NAND type flash memory device as an example.

(1) First Embodiment

The first embodiment relates to the base structure of an end area of the word line in which an active area different from the active area constituting the line & space structure is arranged just below the word line in the word line contact area.

A. Layout

FIG. 3 shows a layout of the end area of the word line of the NAND type flash memory device.

Within the memory cell array area, an active area AA and an element isolation insulating layer (element isolation area) STI, constituting the line & space structure, are arranged. Both the active area AA and the element isolation insulating layer STI extend in a column direction.

At a portion adjacent to the memory cell array area in the word line contact area, like the memory cell array area, the line & apace structure-based active area AA and element isolation insulating layer STI extending in the column direction are arranged.

However, the width in the row direction of the active area AA and the element isolation insulating layer STI in the word line contact area is wider than that in the memory cell array area.

Here, a pattern for sequentially widening the width in the row direction of the active area AA and the element isolation insulating layer STI at an end area of the line & space structure is employed as a technique to reduce any disturbance in the transfer pattern performed by photolithography.

A plurality of word lines WL1, . . . WL8 and select gate lines SGS, SGD are arranged to straddle the memory cell array area and the word line contact area.

The plurality of word lines WL1, . . . WL8 and select gate lines SGS, SGD extend in the row direction, and have the metal silicide structure. To the plurality of word lines WL1, . . . WL8, a fringe F is added, and a contact hole CH to connect the word line driver with the word line is arranged on the fringe F.

Then, in the word line contact area, an active area AA different from the active area with the line & space structure is arranged.

The active area AA includes an area in which the contact holes CH to the plurality of word lines WL1, . . . WL8 are arranged.

Meanwhile, the fringe F is omitted, and the contact hole CH may be directly arranged on the word lines WL1, . . . WL8.

As mentioned above, if employing a layout to arrange the active area AA in the word line contact area, it becomes possible to open an upper portion of the void among the plurality of word lines WL1, . . . WL8. For this reason, at the time of removing any unreacted metal after silicide formation of the plurality of word lines WL1, . . . WL8, the dissolved liquid of the metal silicide does not remain at the space among the word lines WL1, . . . WL8.

B. Sectional Structure

Figure 4:
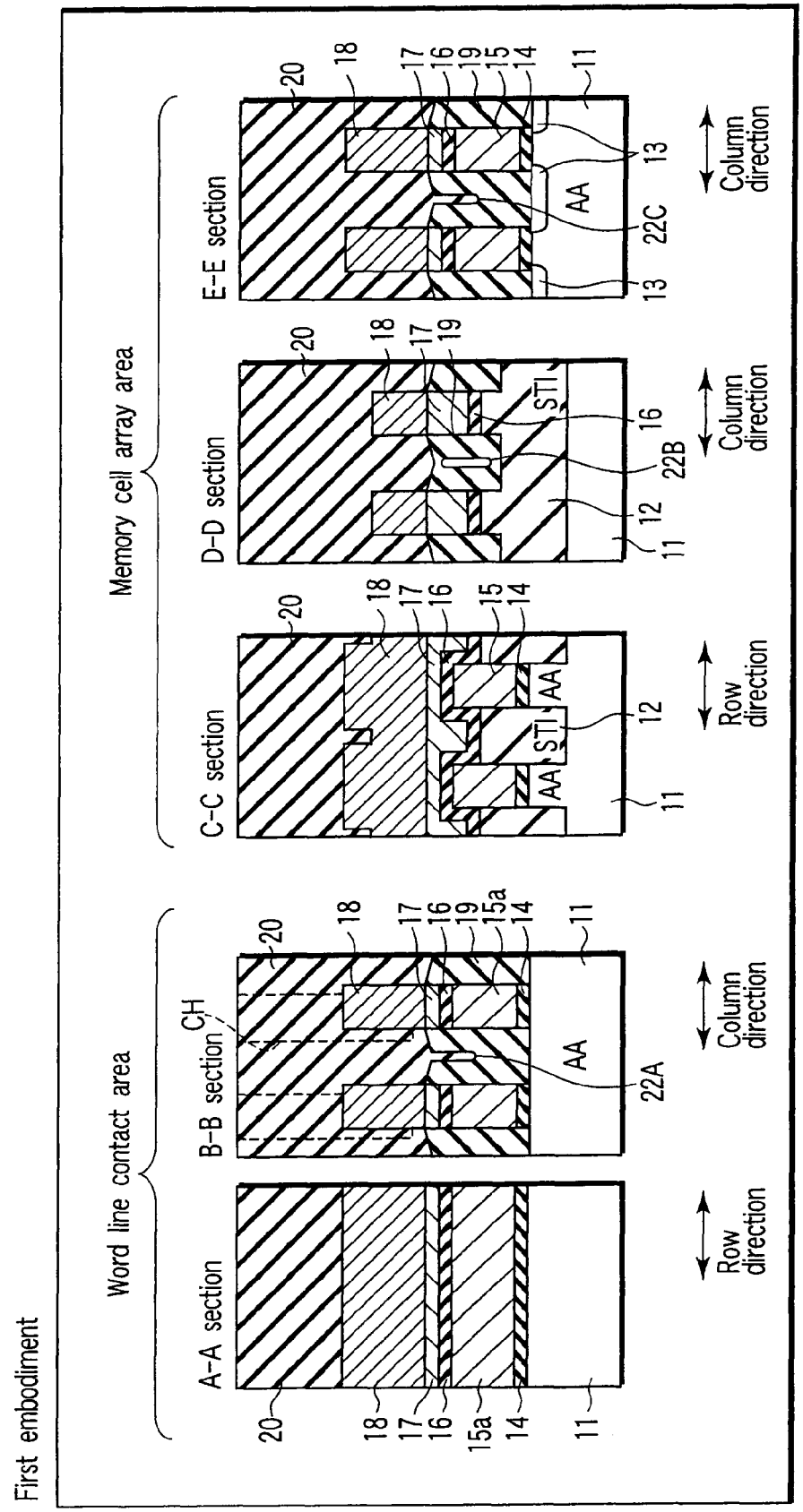
FIG. 4 is a cross sectional view showing a device structure of the first embodiment.

FIG. 4 shows respective sections along line A-A, line B-B, line C-C, line D-D and line E-E of FIG. 3.

On a semiconductor substrate 11, an element isolation insulating layer 12 with the STI (shallow trench isolation) structure is arranged. An area other than the element isolation area where the element isolation insulating layer 12 is arranged results in the active area AA.

In the semiconductor substrate 11 in the memory cell array area, a source/drain diffusion layer 13 is arranged. Here, although the diffusion layer is also formed in the semiconductor substrate 11 in the word line contact area, a bit line contact is not connected to the diffusion layer.

Within the memory cell array area, on a channel area between source/drain diffusion layers 13, a floating gate electrode 15 is arranged via a gate insulating film (tunnel oxide film) 14. The floating gate electrode 15 is constituted from, for instance, a conductive polysilicon film including an impurity.

In the word line contact area, on the semiconductor substrate 11, a dummy gate electrode 15a is arranged via the gate insulating film 14. The dummy gate electrode 15a has same structure as the floating gate electrode 15 and does not function as the floating gate electrode.

On the floating gate electrode 15 and the dummy gate electrode 15a, control gate electrodes, each of which includes a conductive polysilicon film 17 having an impurity and a metal silicide film 18 with a resistance lower than that of the conductive polysilicon film 17, are arranged via an inter-gate insulating film (block insulating film) 16.

Spaces between the stack gate structures composed of the floating/dummy gate electrodes 15, 15a and the control gate electrode, are filled with insulating films 19 and 20.

Here, voids 22A, 22B and 22C are formed on the insulating film 19 between the control gate electrodes as the word lines.

The voids 22A, 22B and 22C are not positively formed, but are formed incidentally when the width of the space between the control gate electrodes as the word lines becomes narrow.

In the present invention, the space between the control gate electrodes as the word lines is filled with two insulating films 19 and 20. These two insulating films 19 and 20 may be formed of the same material or different materials.

An important point is that the highest portion of the insulating film 19 exists on a position lower than upper surfaces of the silicide film 18, and higher than lower surfaces of the conductive polysilicon film 17 in both the active area and the element isolation area. A position of the voids 22A, 22B and 22C depend on a position of an upper surface of the silicide films 18. The voids 22A, 22B and 22C are formed in a position where a distance from a level of the upper surface of the silicide films 18 is same. A position of the upper surface of the silicide film formed on the active area is higher than a position of the upper surface of the element isolation area by the difference in whether an floating/dummy gate electrodes exist or not. Then the position of the voids 22A, 22C formed in an active area are higher than the position of the void 22B formed in the element isolation area. As a result, the upper portion of the voids 22A and 22C on the active area AA is opened.

However, the void 22B on the element isolation insulating layer 12 is formed at a deep position between the control gate electrodes, and therefore, its upper portion is not opened.

Here, in the present invention, the upper surface of the insulating film 19 is not made lower until the upper portion of the void 22B on the element isolation insulating layer 12 is opened.

This is because, if setting the upper surface of the insulating film 19 to be excessively low, the void is formed again at the insulating film 20 when forming the insulating film 20.

In addition, since the void 22B on the element isolation insulating layer 12 is communicated with the void 22C on the active area AA, it is sufficient for the void 22B to open the upper portion of the voids 22B and 22C on the active area AA.

Further, the reason why the upper portion of the void 22B is not opened, as explained later in the manufacturing method, is that the present invention employs the process for forming a metal silicide film 18 after forming the insulating film 19. In this case, the lower surface of the metal silicide film 18 is formed at the same level to the highest potion of the insulating film 19 or at a position lower than the highest portion of the insulating film 19.

Meanwhile, in the present invention, although the void 22B on the element isolation insulating layer 12 is not positively opened, occasionally, there is the case where the void 22B is formed at a shallow position of a space between the control gate electrodes, in which case there is no problem at all even if the upper portion of the void 22B is opened.

According to such a structure, even when the dissolved liquid of the metal silicide film 18 flows into the voids 22A, 22B and 22C at the time of removing the unreacted metal after silicide formation of the word line, since the openings exist at the voids 22A and 22C at that time point, the dissolved liquid of the metal silicide does not remain in the voids 22A, 22B and 22C.

C. Manufacturing Method

FIGS. 5 to 11 show examples of the method of manufacturing the NAND type flash memory device of FIGS. 3 and 4. In these drawings, respective sections correspond to broken lines of FIG. 3.

Figure 5:
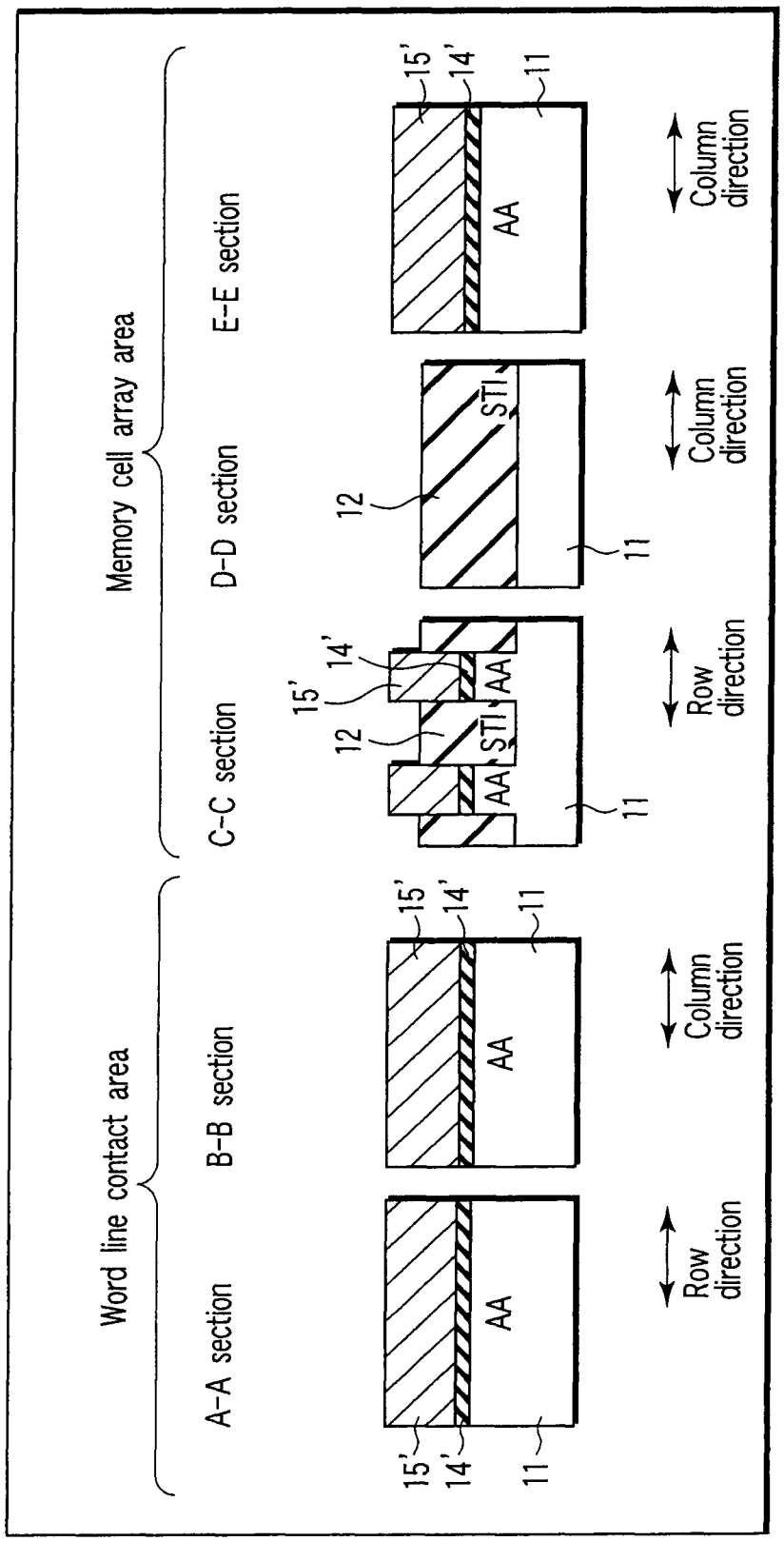
FIG. 5 is a cross sectional view showing one process of a manufacturing method.

Firstly, as shown in FIG. 5, by using the thermal oxidation method, on the semiconductor substrate (for instance, silicon substrate) 11, for instance, a silicon oxide film 14' is formed. In addition, by using the CVD method, on the silicon oxide film 14', a conductive polysilicon film 15' including impurities is formed.

In addition, a trench of the line & space pattern extending in the column direction is formed on the semiconductor substrate 11, the silicon oxide film 14' and the conductive polysilicon film 15'.

Then, a silicon oxide film for filling the trench is formed. The silicon oxide film may be formed by the CVD method, or an applied type oxide film may be used as the silicon oxide film.

In addition, by using the CMP method, the element isolation insulating layer 12 with an STI structure is formed while grinding the silicon oxide film. The grinding is performed until the upper surface of the silicon oxide film coincides with the upper surface of the conductive polysilicon film 15', or becomes slightly lower than the upper surface of the conductive polysilicon film 15'.

Further, the word line contact area is covered by a photoresist film, the element isolation insulating layer (silicon oxide film) 12 in the memory cell array area is etched-back, and the upper surface of the element isolation insulating layer 12 in the memory cell array area is lowered.

In this manner, a side surface in the row direction of the conductive polysilicon film 15' in the memory cell array area is exposed.

Next, as shown in FIG. 6, on the conductive polysilicon film 15', an inter-gate insulating film (block insulating film) 16' is formed. The inter-gate insulating film 16' is constituted from the stack structure of an oxide film and nitride film, such as ONO or the like, or a high dielectric material (High-k material) or the like.

The inter-gate insulating film 16' covers an upper surface and a side surface of the conductive polysilicon film 15' in the memory cell array area.

In addition, by using the CVD method, on the inter-gate insulating film 16', a conductive polysilicon film 17' including impurities is formed.

Further, on the conductive polysilicon film 17', a photoresist film of the line & space pattern extending in the row direction is formed, and with the photoresist film as a mask, the conductive polysilicon film 17', the inter-gate insulating film 16', the conductive polysilicon film 15' and the silicon oxide film 14' are etched sequentially.

By this etching, for instance, the upper surface of the element isolation insulating layer 12 in the memory cell array area is somewhat etched.

Figure 7:
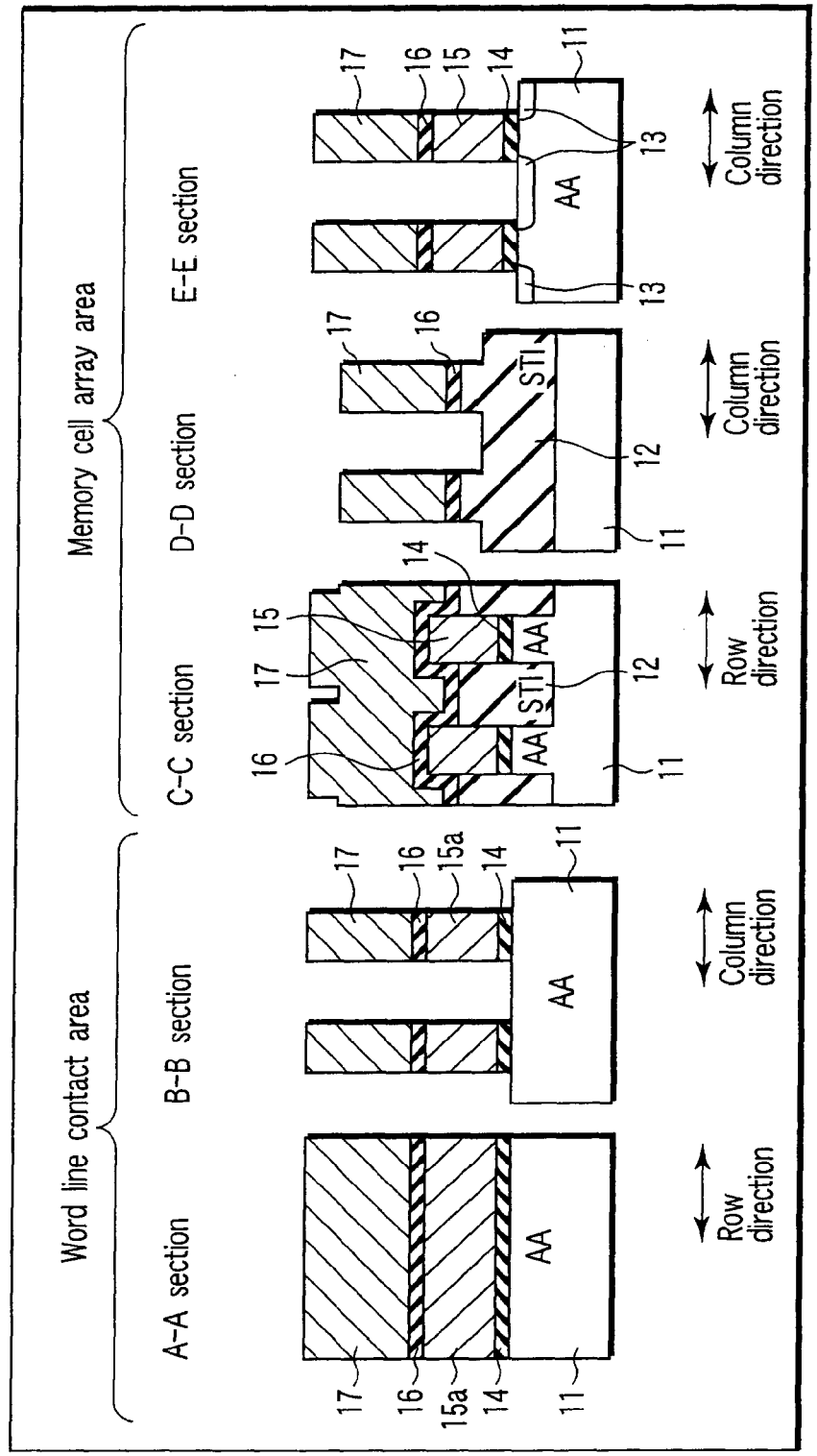
FIG. 7 is a cross sectional view showing one process of the manufacturing method.

As a result, as shown in FIG. 7, on the active area AA in the memory cell array area, the stack gate structure composed of the gate insulating film 14, the floating gate electrode 15, the inter-gate insulating film 16 and the conductive polysilicon film 17 of the control gate electrode is completed; on the active area AA in the word line contact area, the stack gate structure composed of the gate insulating film 14, the dummy gate electrode 15a, the inter-gate insulating film 16 and the conductive polysilicon film 17 of the control gate electrode is completed; and on the element isolation insulating layer 12, the structure composed of the inter-gate insulating film 16 and the conductive polysilicon film 17 of the control gate electrode is completed.

After that, the photoresist film is removed.

In addition, by using an ion implantation method, impurities are injected into the semiconductor substrate 11 in the memory cell array area in a self-aligning manner. Then, an annealing to activate the impurities is implemented; and the source/drain diffusion layer 13 is formed in the semiconductor substrate 11.

At this time, although the diffusion layer is formed also in the semiconductor substrate 11 in the word line contact area, if the bit line contact is not formed on the diffusion layer, a transistor formed in the word line contact area results in a dummy, so that the transistor does not actually operate.

Figure 8:
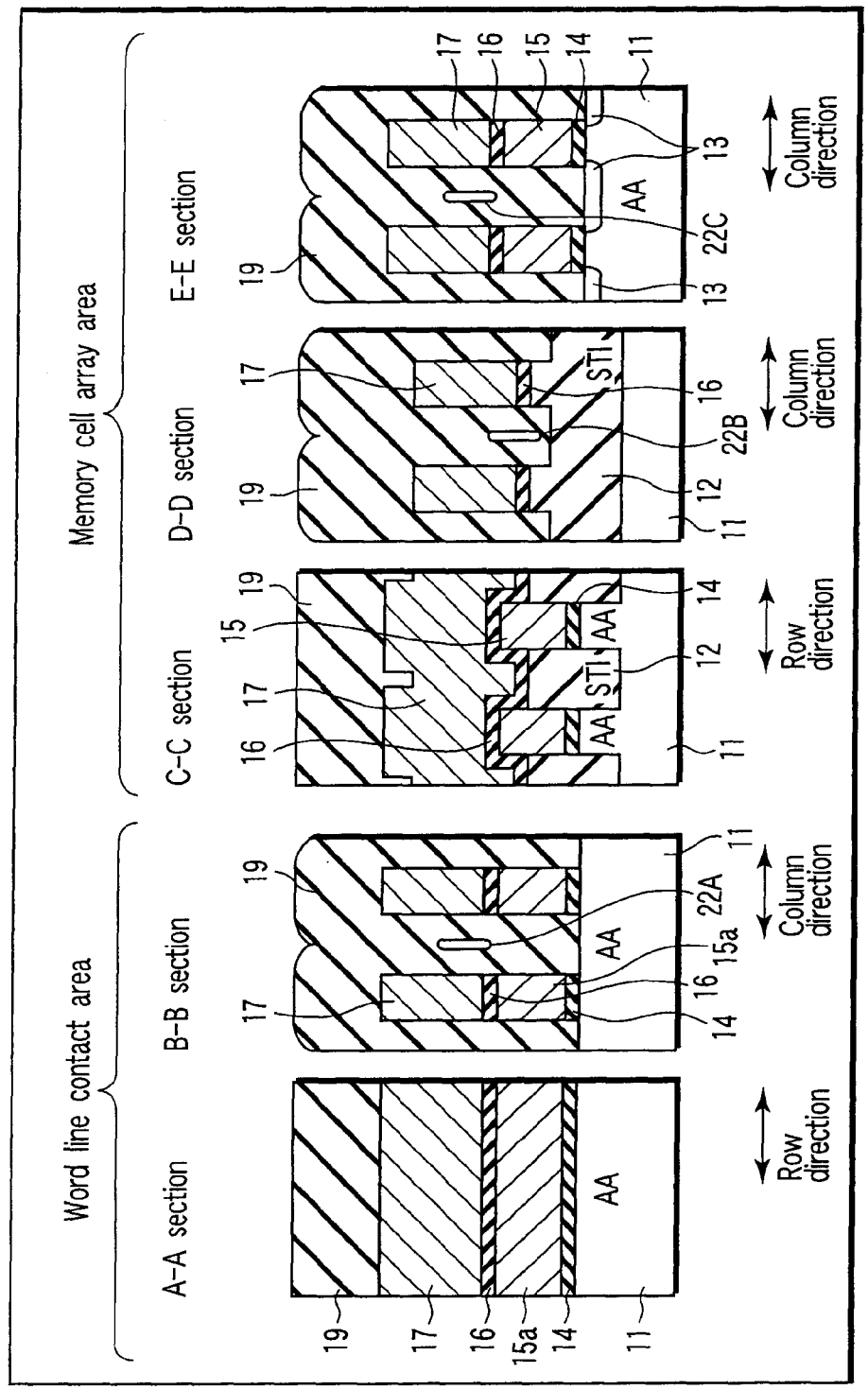
FIG. 8 is a cross sectional view showing one process of the manufacturing method.

Next, as shown in FIG. 8, by using the CVD method, by filling a space between the conductive polysilicon films 17 with the line & space structure, a TEOS oxide film, or an insulating film 19 formed of boron(B)-doped oxide film, phosphorous(P)-doped oxide film or the like is formed.

At this time, between the control gate electrodes 17 in the word line contact area, the void 22A is formed. In addition, between the conductive polysilicon films 17 in the memory cell array area, the voids 22B and 22C are formed.

Next, as shown in FIG. 9, by using the CMP method, the insulating film 19 is ground until the upper surface of the insulating film 19 coincides with the upper surface of the control gate electrode 17, or becomes slightly lower than the upper surface of the conductive polysilicon films 17.

Figure 10:
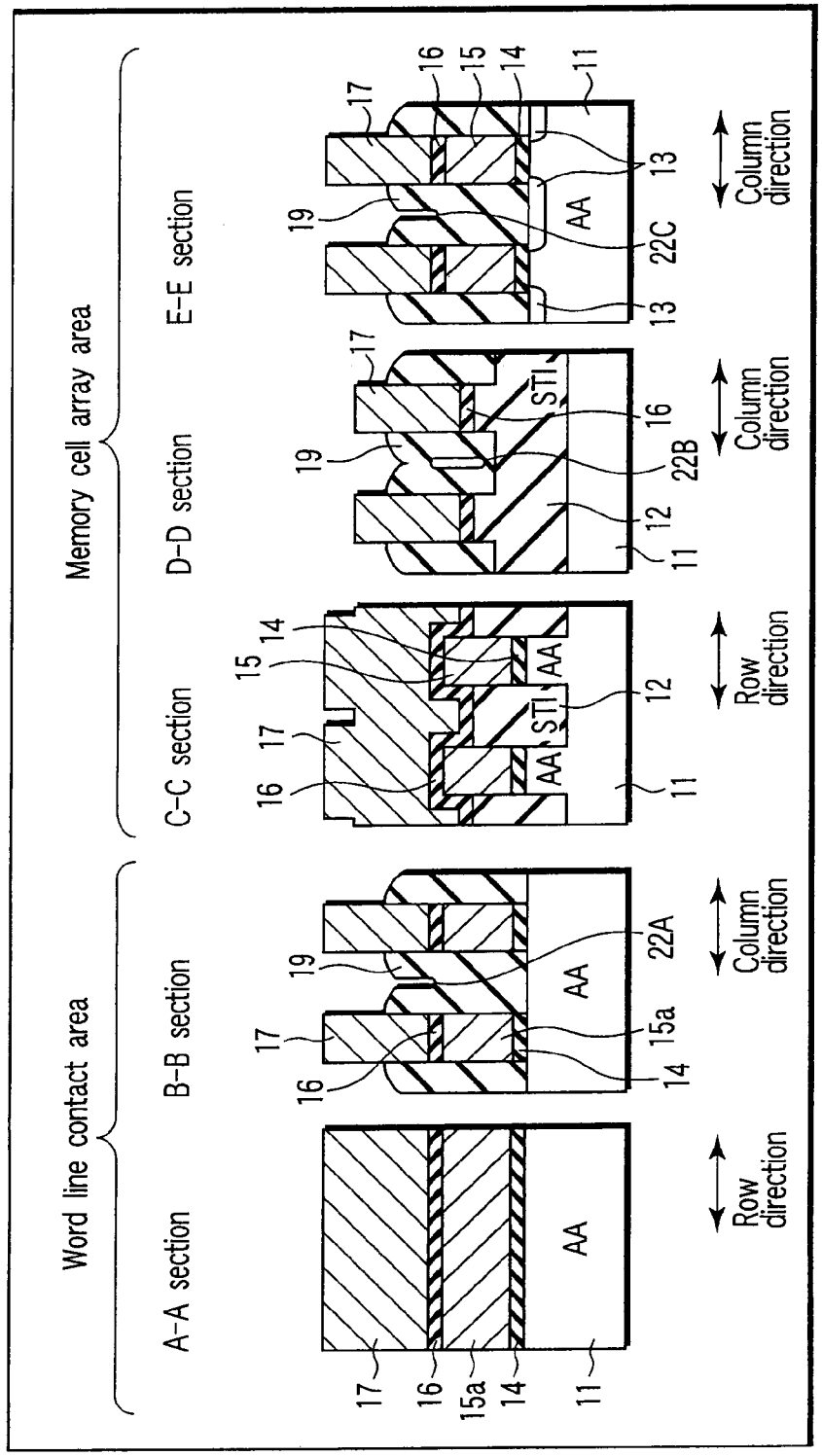
FIG. 10 is a cross sectional view showing one process of the manufacturing method.

Subsequently, as shown in FIG. 10, by using anisotropic dry etching, the insulating film 19 is etched. This etching is performed at least up to the point where the upper portion of the voids 22A and 22C on the active area AA is opened. By this etching, the insulating film 19 includes a recess at an upper portion thereof in the active area of the memory cell array area and the word line contact area.

In addition, in consideration of a silicide process described later, the highest portion of the insulating film 19 is set to a position lower than an upper surface of the conductive polysilicon films 17, and a position higher than a lower surface of the conductive polysilicon films 17.

Here, since the void 22B on the element isolation insulating layer 12 is formed at a position lower than the voids 22A and 22C on the active area AA, the upper portion of the void 22B is rarely opened by this etching.

Figure 11:
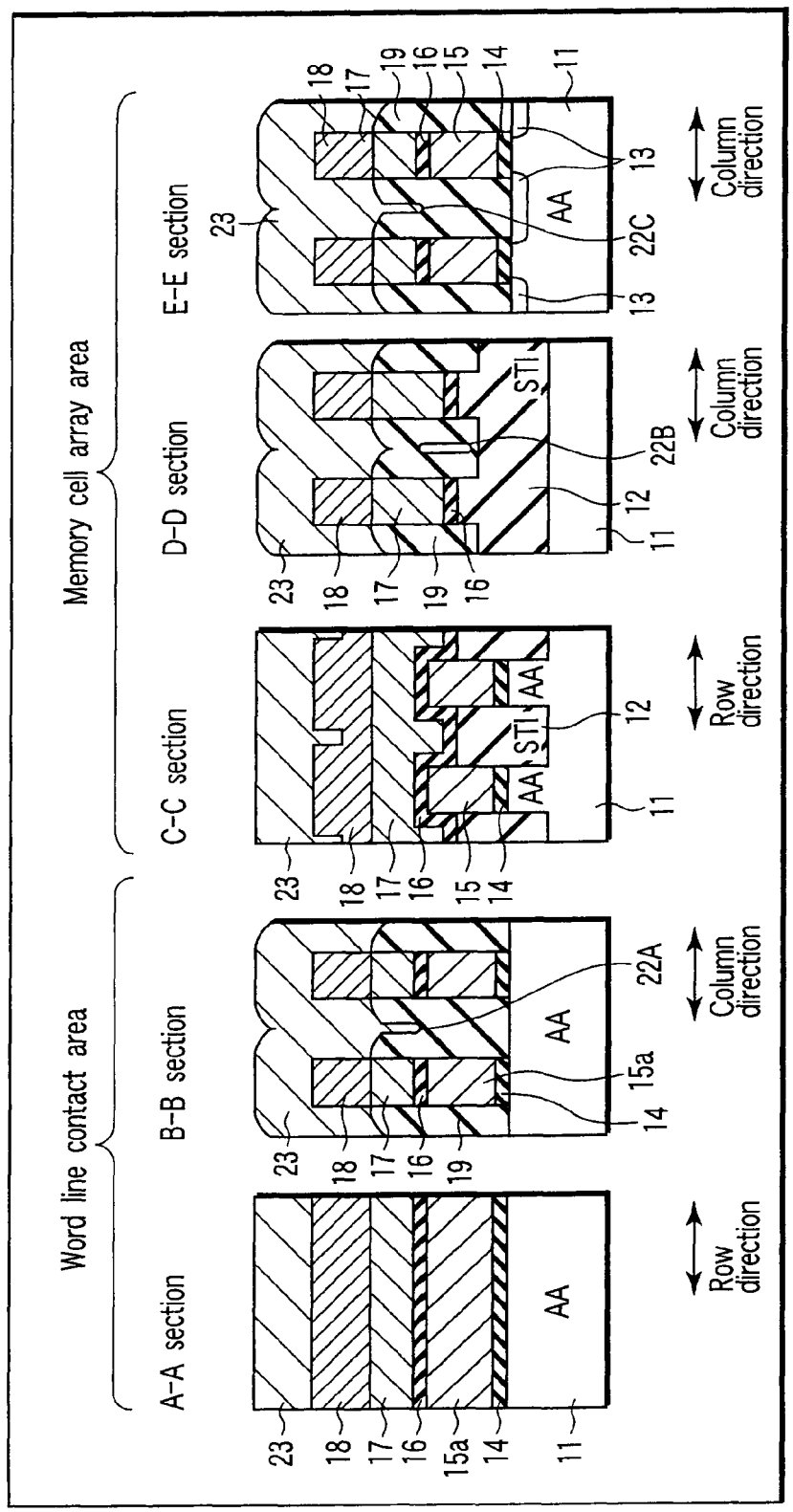
FIG. 11 is a cross sectional view showing one process of the manufacturing method.

Next, as shown in FIG. 11, on the conductive polysilicon film 17, the metal film 23 such as tungsten (W), cobalt (Co), nickel (Ni), titanium (Ti) or the like is formed. In addition, the metal silicide film (for instance, WSi, CoSi, NiSi, TiSi, or the like) 18 is formed in such a way that the upper portion of the conductive polysilicon films 17 and the metal film 23 are brought into a solid phase reaction while performing a heat treatment at a temperature of approximately 500° C. or more.

After that, by using a mixture of sulfuric acid and hydrogen peroxide solution, the unreacted metal film 23 is removed.

Here, since the highest portion of the insulating film 19 is set at a position higher than the lower surface of the control gate electrode 17, the control gate electrode results in the stack structure of the conductive polysilicon film 17 and the metal silicide film 18.

In addition, the lower surface of the metal silicide film 18 is formed at the same level to the highest portion of the insulating film 19 or at a position lower than the highest portion of the insulating film 19.

Meanwhile, when removing the unreacted metal film 23, the dissolved liquid of the metal silicide film 18 and the metal film 23 flows into the voids 22A, 22B and 22C. However, in the present invention, since the upper portion of the voids 22A and 22C is opened, the dissolved liquid does not remain in the voids 22A, 22B and 22C.

Figure 12:
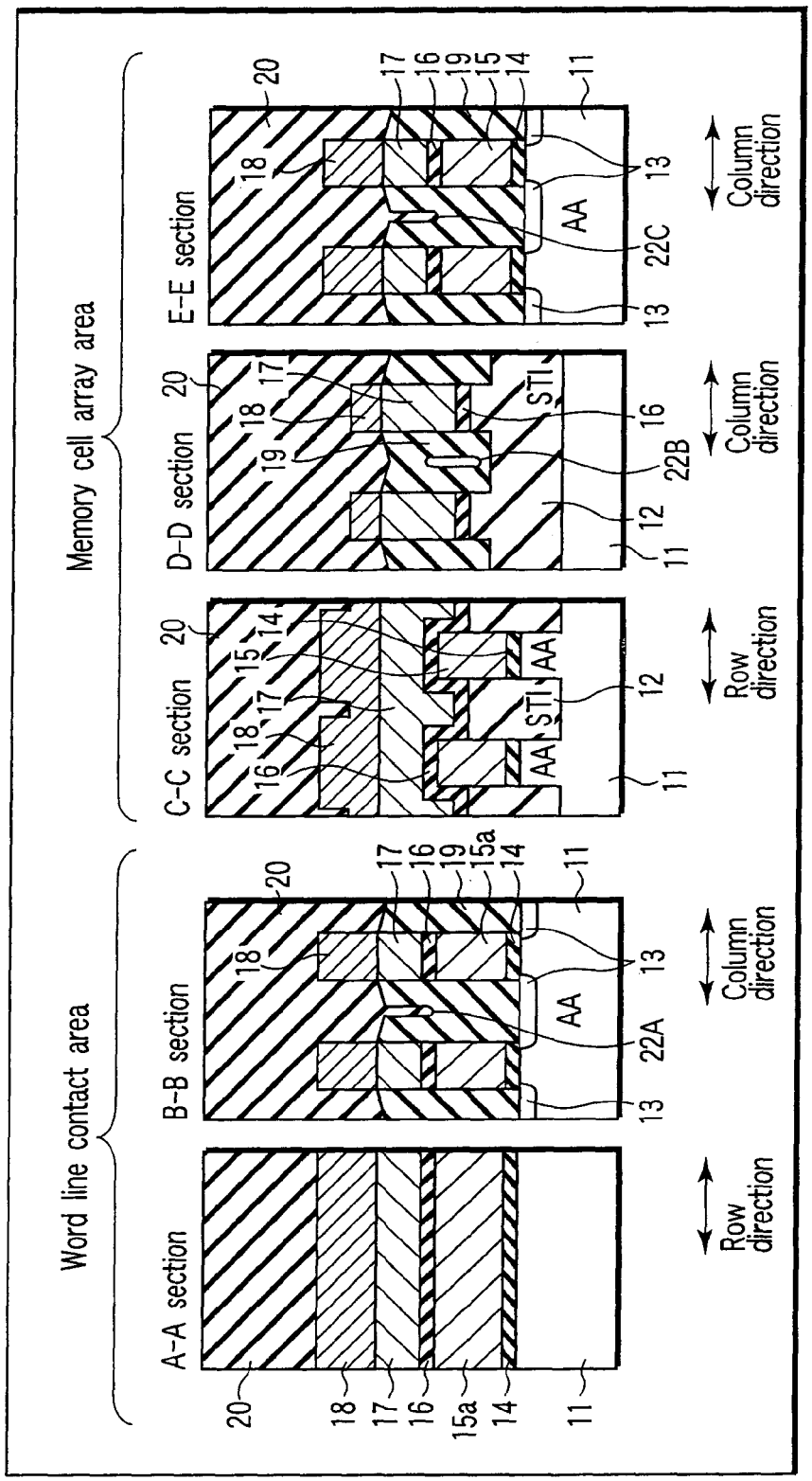
FIG. 12 is a cross sectional view showing one process of the manufacturing method.

Next, as shown in FIG. 12, by using the CVD method, by filling a space between the control gate electrodes with the line & space structure, a TEOS oxide film, or an insulating film 20 formed of boron(B)-doped oxide film, phosphorous (P)-doped oxide film or the like is formed.

At this time, since an aspect ratio (depth/width) of the space between the control gate electrodes becomes small, a void is not formed in the insulating film 20 between the control gate electrodes.

In addition, at this time, if the insulating film 20 fills the voids 22A, 22B and 22C formed on the insulating film 19, the voids 22A, 22B and 22C disappear.

Further, when the insulating film 20 closes the opening of the voids 22A, 22B and 22C formed on the insulating film 19, the complete voids 22A, 22B and 22C are formed again.

In the present example, shown is the case where the voids 22A and 22C are filled with the insulating film 20, and the void 22B remains.

Then, finally, as shown in FIG. 4, the contact hole CH coming into contact with the end area of the control gate electrodes (word line) is formed on the insulating film 20.

According to the above steps, the NAND type flash memory device of FIGS. 3 and 4 is completed.

D. Effect

As mentioned above, according to the first embodiment, in the word line contact area, by arranging an active area different from the line & space structure-based active area just below the plurality of word lines, the dissolved liquid of the metal or metal silicide does not remain at the space between the word lines.

Figure 13:
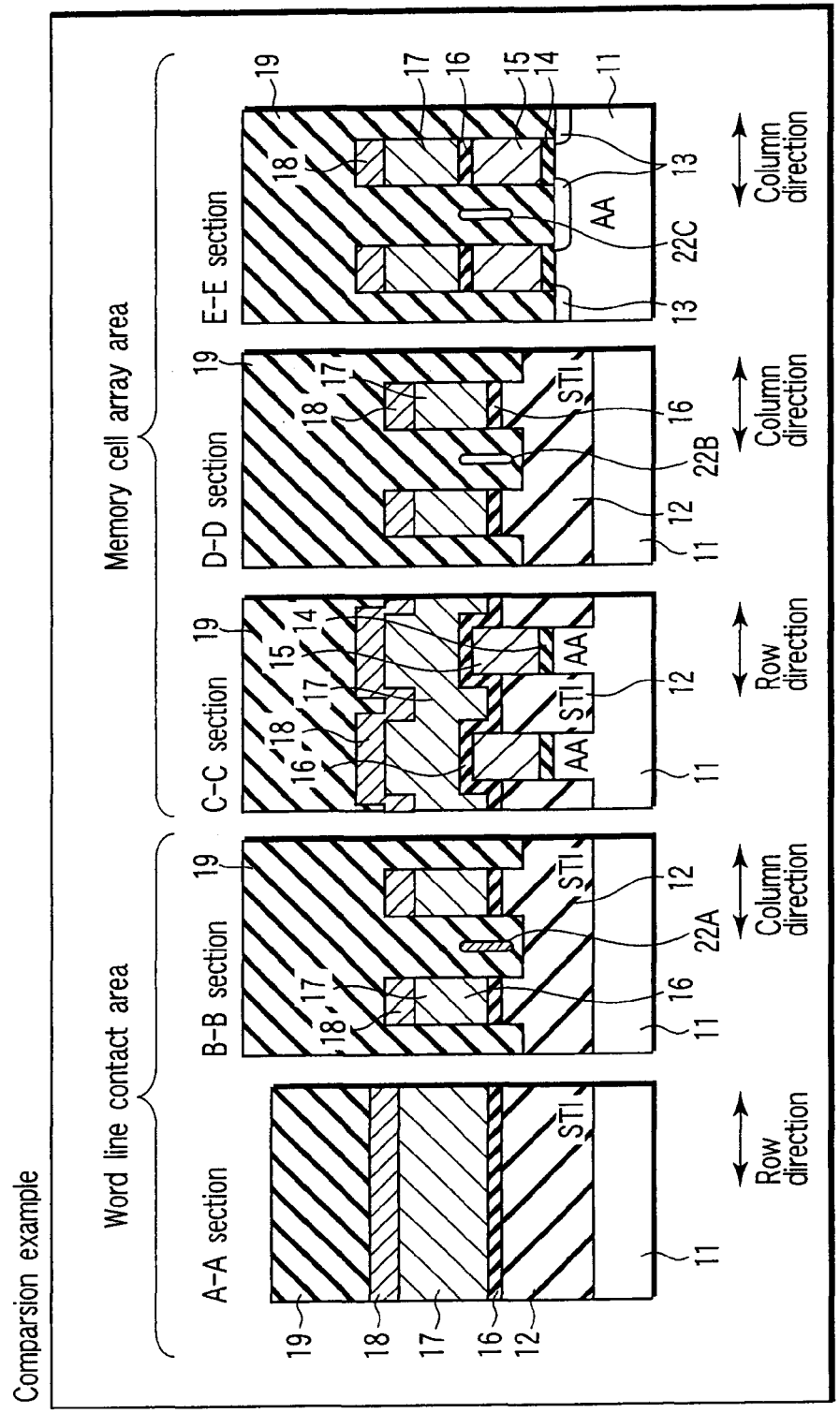
FIG. 13 is a cross sectional view showing a device structure as a comparative example.

FIG. 13 shows the device structure as a comparative example.

In the comparative example, the element isolation insulating layer 12 is evenly formed in the word line contact area. In this case, in the insulating film 19 between the control gate electrodes (word line) in the word line contact area, an elongated tunnel shape void 22A is formed.

Figure 14:
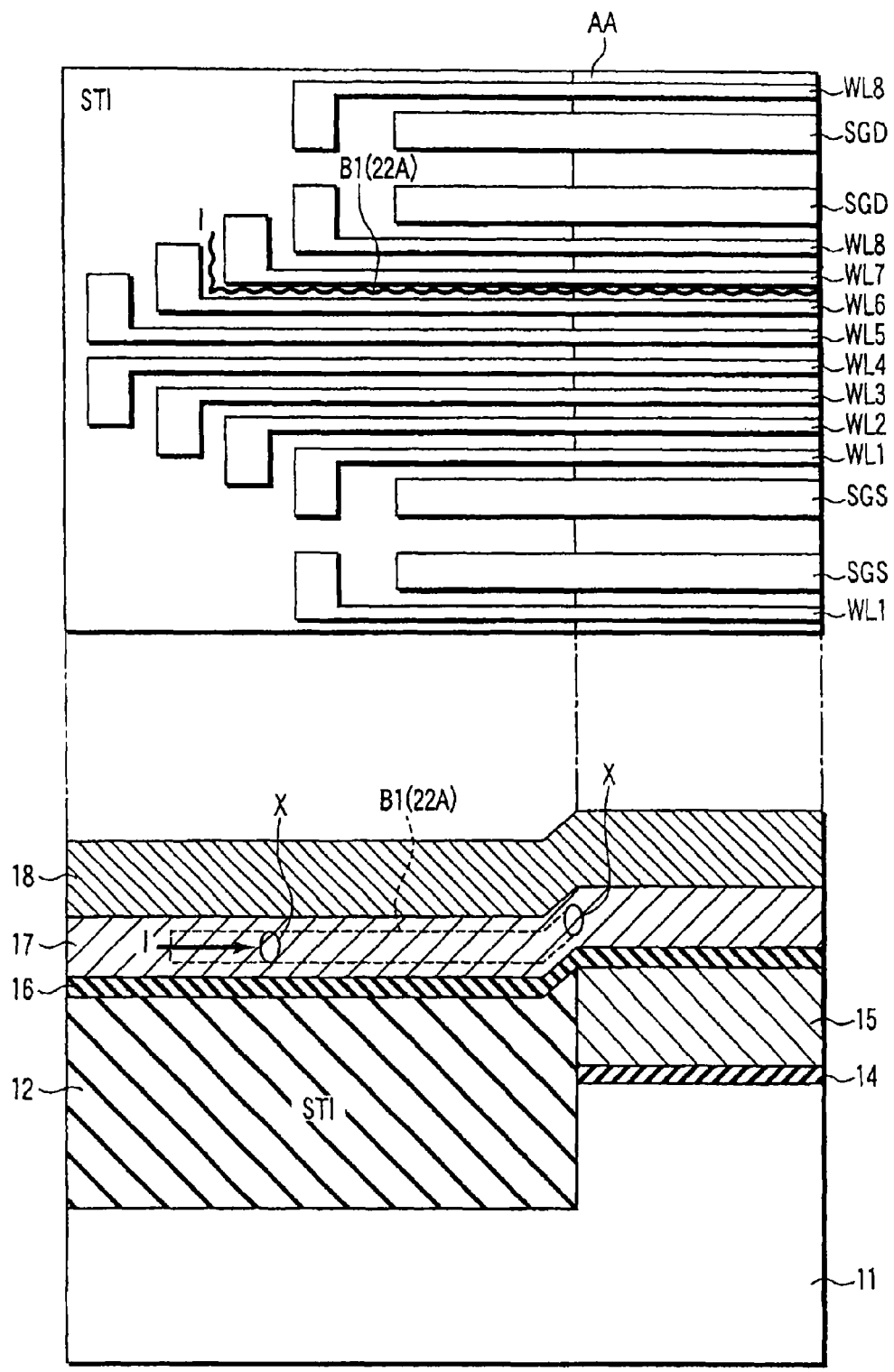
FIG. 14 is a view showing a model in which dissolved liquid accumulates in a void.

In this case, as shown in FIG. 14, in the course of the manufacturing process, dissolved liquid X of the metal silicide flows into the void B1 (22A) from an admission port I at an end area of, for instance, the word lines WL1 to WL8; and the dissolved liquid X of the metal silicide markedly remains in the region of a step difference of an end area of the element isolation insulating layer 12.

At the same time, in the case of the device structure of FIG. 12, the upper portion of the void 22A formed on the insulating film 19 between the control gate electrodes (word line) in the word line contact area is opened.

Figure 15:
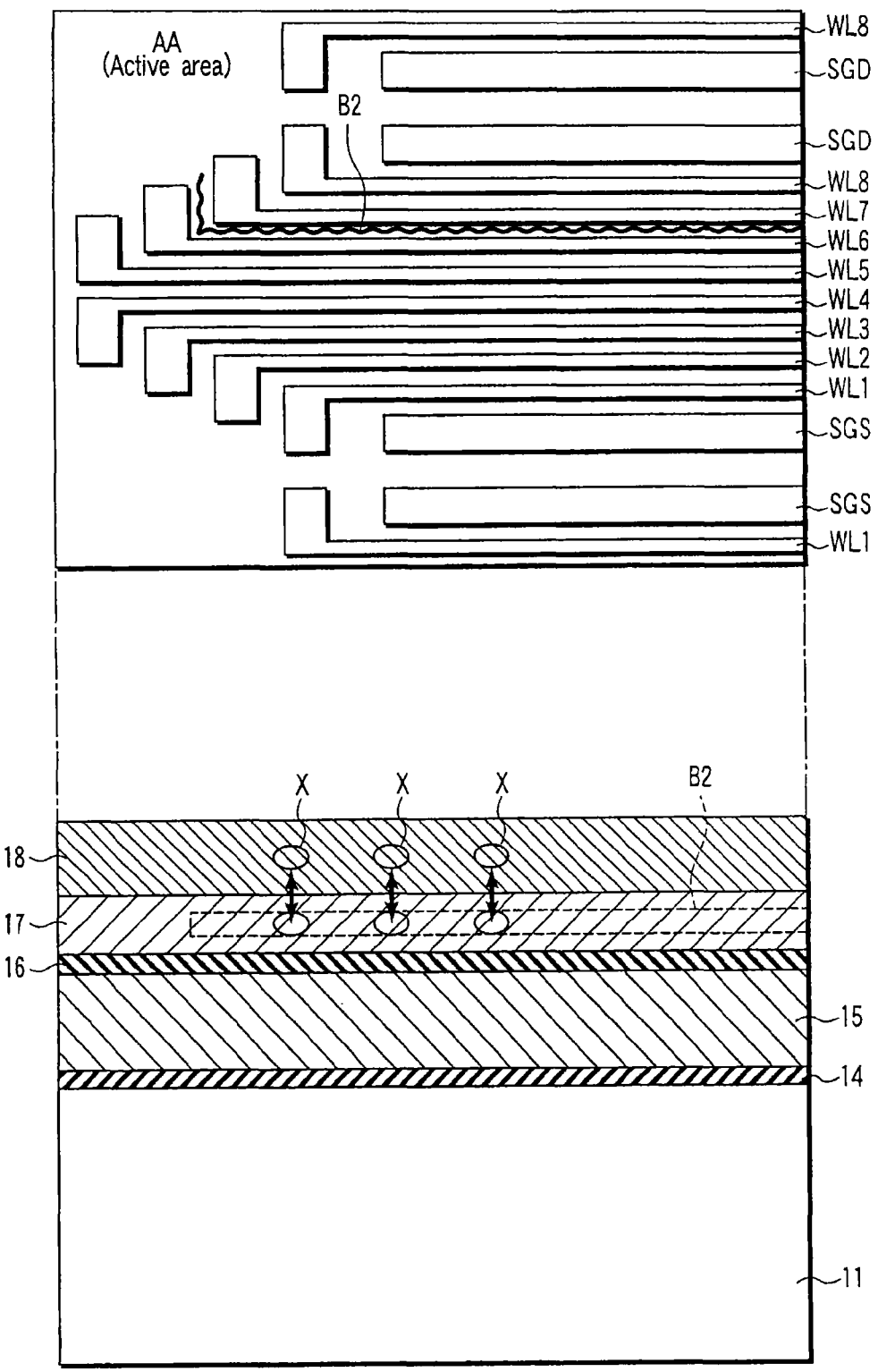
FIG. 15 is a view showing a model in which the dissolved liquid flows out of the void.

Therefore, as shown in FIG. 15, in the course of the manufacturing process, even though, for instance, the dissolved liquid X of the metal silicide flows into the void B2 (22A), the dissolved liquid X flows out immediately, and thus it does not remain in the void B2 (22A).

(2) Second Embodiment

The second embodiment relates to a base structure of an end area of the word line, in which an active area constituting the line & space structure is arranged just below the word line up to the tip of the word line in the word line contact area from the boundary between the memory cell array area and the word line contact area.

A. Layout

Figure 16:
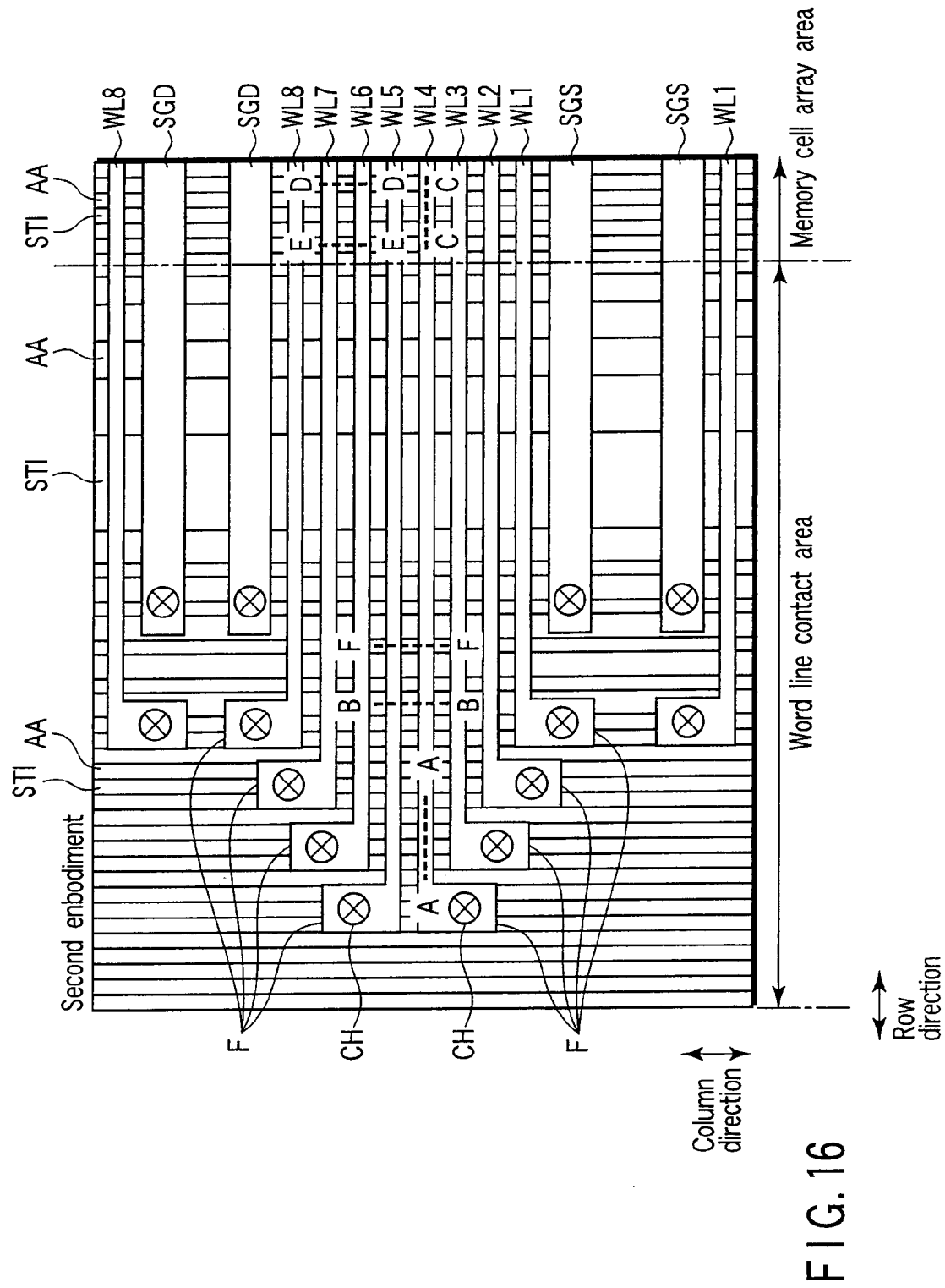
FIG. 16 is a plan view showing a layout of a second embodiment.

FIG. 16 shows a layout of an end area of the word line of a NAND type flash memory device.

Within the memory cell array area, a line & space structure-based active area AA and an element isolation insulating layer (element isolation area) STI are arranged. Both the active area AA and the element isolation insulating layer STI extend in the column direction.

A plurality of word lines WL1, . . . WL8 and select gate lines SGS, SGD are arranged to straddle the memory cell array area and the word line contact area.

The plurality of word lines WL1, . . . WL8 and select gate lines SGS, SGD extend in the row direction, and have the metal silicide structure. To the plurality of word lines WL1, . . . WL8, a fringe F is added, and a contact hole CH to connect the word line driver with the word line is arranged on the fringe F.

Meanwhile, the fringe F may be omitted, and the contact hole CH may be directly arranged on the word lines WL1, . . . WL8.

Then, in the word line contact area, arranged is the active area AA constituting the line & space structure, just below the word lines WL1, . . . WL8, up to the tip of the plurality of word lines WL1, . . . WL8 in the word line contact area from the boundary between the memory cell array area and the word line contact area.

Each width of the active area AA and the element isolation insulating layer STI (line & space) in the word line contact area is set to be the same as that in the memory cell array area, that is, set to the minimum width (for instance, a minimum processing size) of a conductive line in a chip.

However, each width of the active area AA and the element isolation insulating layer STI in a part adjacent to the memory cell array area in the word line contact area is set broader than that in the memory cell array area.

Meanwhile, each width of the active area AA and the element isolation insulating layer STI in the word line contact area may be different from that in the memory cell array area.

For instance, a pitch of the line & space in the word line contact area may be set to several times that of the line & space in the memory cell array area, or the pitch and each width of the line & space in the word line contact area may be irregular.

As mentioned above, if employing the layout arranging the active area AA in the word line contact area, it becomes possible to open the upper portion of the void among the plurality of word lines WL1, . . . WL8. For this reason, at the time of removing any unreacted metal after silicide formation of the plurality of word lines WL1, . . . WL8, the dissolved liquid of the metal silicide does not remain at the space among the word lines WL1, . . . WL8.

B. Sectional Structure

Figure 17:
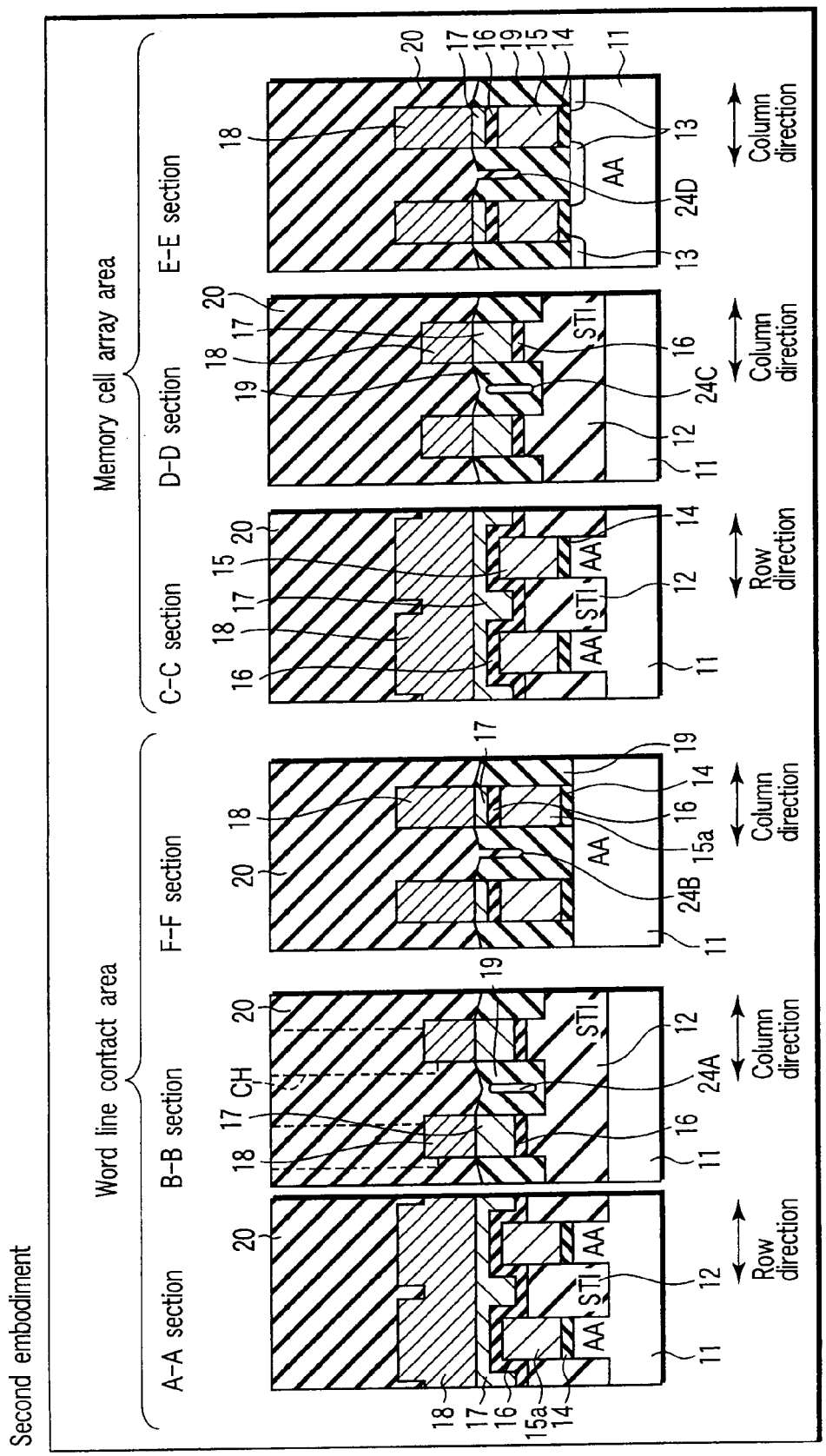
FIG. 17 is a cross sectional view showing a device structure of the second embodiment.

FIG. 17 shows respective sections along line A-A, line B-B, line C-C, line D-D, line E-E and line F-F of FIG. 16.

On a semiconductor substrate 11, an STI structure-based element isolation insulating layer 12 is arranged. An area surrounded by the element isolation insulating layer 12 results in the active area AA.

Within the semiconductor substrate 11 in the memory cell array area, a source/drain diffusion layer 13 is arranged. Here, although the diffusion layer is formed also in the semiconductor substrate 11 in the word line contact area, a bit line contact is not connected to the diffusion layer.

Within the memory cell array area, on a channel area between the source/drain diffusion layers 13, a floating gate electrode 15 is arranged via a gate insulating film (tunnel oxide film) 14. The floating gate electrode 15 is constituted from, for instance, a conductive polysilicon film including an impurity.

Similarly, in the word line contact area, on the semiconductor substrate 11, a dummy gate electrode 15a is arranged via the gate insulating film 14. The dummy gate electrode 15 in the word line contact area has same structure as the floating gate electrode 15 and does not function as the floating gate electrode.

On the floating gate electrode 15 and the dummy gate electrode, control gate electrodes, each of which includes a conductive polysilicon film 17 having impurities and a metal silicide film 18 with a resistance lower than that of the conductive polysilicon film 17, are arranged via an inter-gate insulating film (block insulating film) 16. In addition, on the element isolation insulating layer 12, the control gate electrodes are arranged via the inter-gate insulating film 16.

The space between the stack gate structures formed of the floating gate electrode 15 and the control gate electrode is filled with insulating films 19 and 20 in the memory cell array area. Also, in the word line contact area, the space between the stack gate structures formed of the dummy gate electrode and the control gate electrode is filled with insulating films 19 and 20.

Here, on the insulating film 19 between the control gate electrodes as the word lines, the voids 24A, 24B, 24C and 24D are formed.

However, like the first embodiment, the highest portion of the insulating film 19 exists at a position lower than the upper surface of the control gate electrodes and higher than the lower surface of the control gate electrodes.

For this reason, the upper portions of the voids 24B and 24D on the active area AA are opened.

In addition, in the present invention, the upper surface of the insulating film 19 is not lowered until the upper portions of the voids 24A and 24C on the element isolation insulating layer 12 are opened. The reason for this is the same as that described in the first embodiment.

However, like the first embodiment, in the case where the voids 24A and 24C are formed at shallow positions of a space between the control gate electrodes, there is no problem even if the upper portions of the voids 24A and 24C are opened.

Meanwhile, two insulating films 19 and 20 may be constituted by the same material or different materials.

According to such a structure, even when the dissolved liquid of the metal silicide film 18 flows into the voids 24A, 24B, 24C and 24D at the time of removing the unreacted metal after silicide formation of the word line, since the openings exist at the voids 24B and 24D at that time point, the dissolved liquid of the metal silicide does not remain in the voids 24A, 24B, 24C and 24D.

C. Manufacturing Method

FIGS. 18 to 25 show examples of a method of manufacturing the NAND type flash memory device of FIGS. 16 and 17. In these drawings, respective sections correspond to broken lines of FIG. 16.

Figure 18:
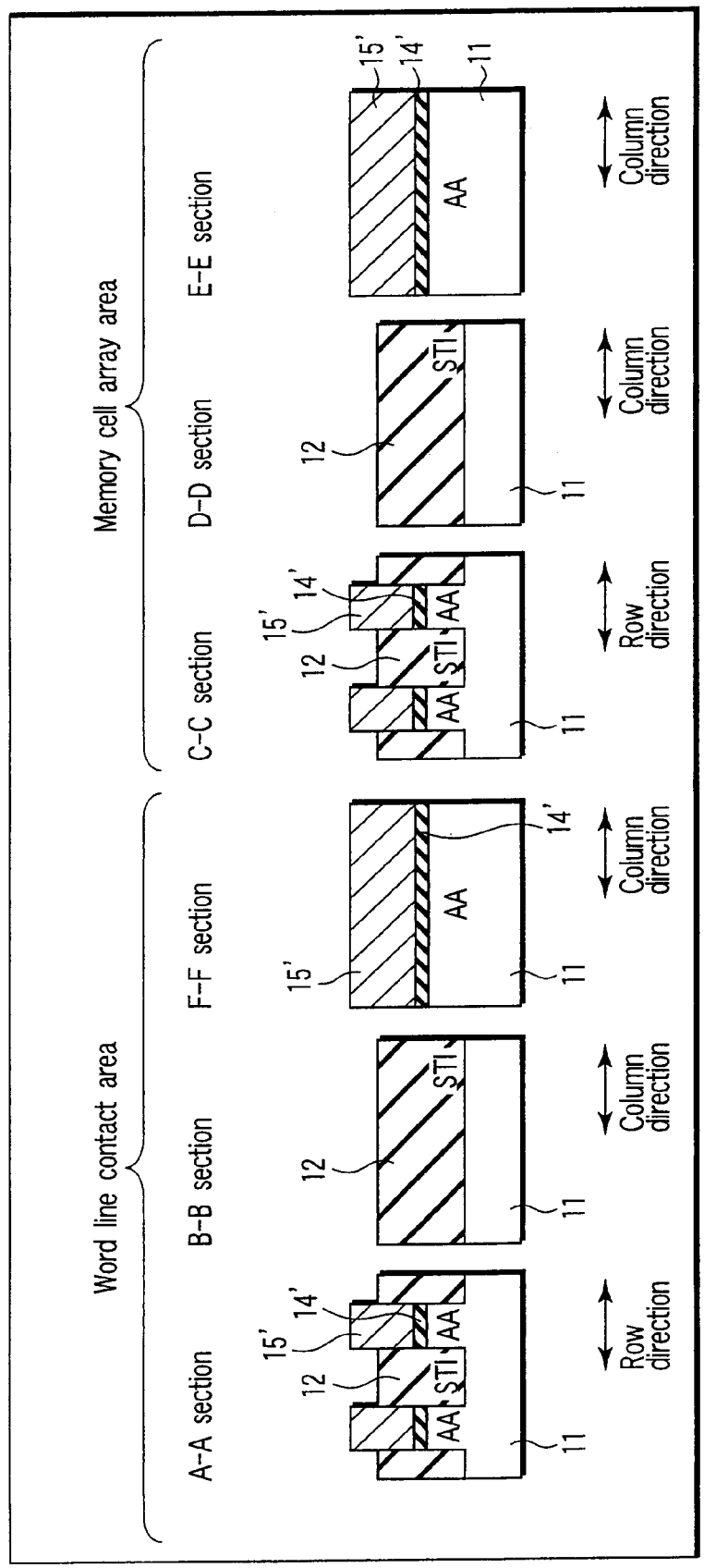
FIG. 18 is a cross sectional view showing one process of a manufacturing method.

Firstly, as shown in FIG. 18, by using the thermal oxidation method, on the semiconductor substrate (for instance, silicon substrate) 11, for instance, a silicon oxide film 14' is formed. In addition, by using the CVD method, on the silicon oxide film 14', a conductive polysilicon film 15' including impurities is formed.

In addition, formed is a trench of the line & space pattern extending in the column direction, on the semiconductor substrate 11, the silicon oxide film 14' and the conductive polysilicon film 15'.

Then, a silicon oxide film for filling the trench is formed. The silicon oxide film may be formed by the CVD method, or an applied type oxide film may be used.

In addition, by using the CMP method for grinding the silicon oxide film, the element isolation insulating layer 12 with the STI structure is formed. The grinding is performed until the upper surface of the silicon oxide film coincides with the upper surface of the conductive polysilicon film 15', or becomes slightly lower than the upper surface of the conductive polysilicon film 15'.

Further, the word line contact area is covered by a photo resist film, the element isolation insulating layer (silicon oxide film) 12 in the memory cell array area is etched-back, and the upper surface of the element isolation insulating layer 12 in the memory cell array area is lowered.

In this manner, a side surface in the row direction of the conductive polysilicon film 15' in the memory cell array area is exposed.

Figure 19:
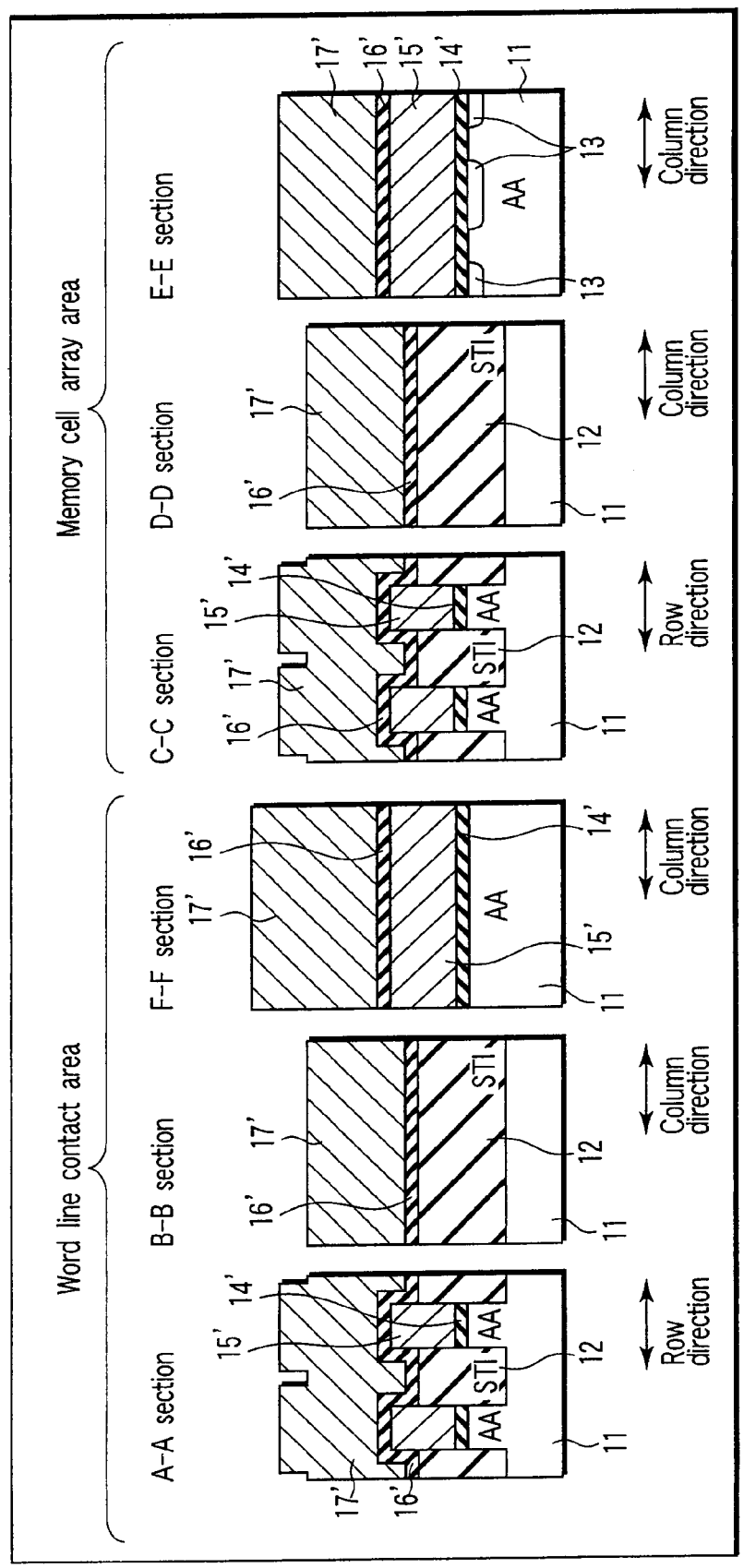
FIG. 19 is a cross sectional view showing one process of the manufacturing method.

Next, as shown in FIG. 19, on the conductive polysilicon film 15', an inter-gate insulating film (block insulating film) 16' is formed. The inter-gate insulating film 16' is constituted from the stack structure of oxide film and nitride film such as ONO or the like, or a high dielectric material (High-k material) or the like.

The inter-gate insulating film 16' covers an upper surface and a side surface of the conductive polysilicon film 15' in the memory cell array area.

In addition, by using the CVD method, on the inter-gate insulating film 16', a conductive polysilicon film 17' including impurities is formed.

Further, on the conductive polysilicon film 17', a photoresist film of the line & space pattern extending in the row direction is formed; and with the photoresist film as a mask, the conductive polysilicon film 17', the inter-gate insulating film 16', the conductive polysilicon film 15' and the silicon oxide film 14' are etched sequentially.

By this etching, for instance, the upper surface of the element isolation insulating layer 12 in the memory cell array area is somewhat etched.

Figure 20:
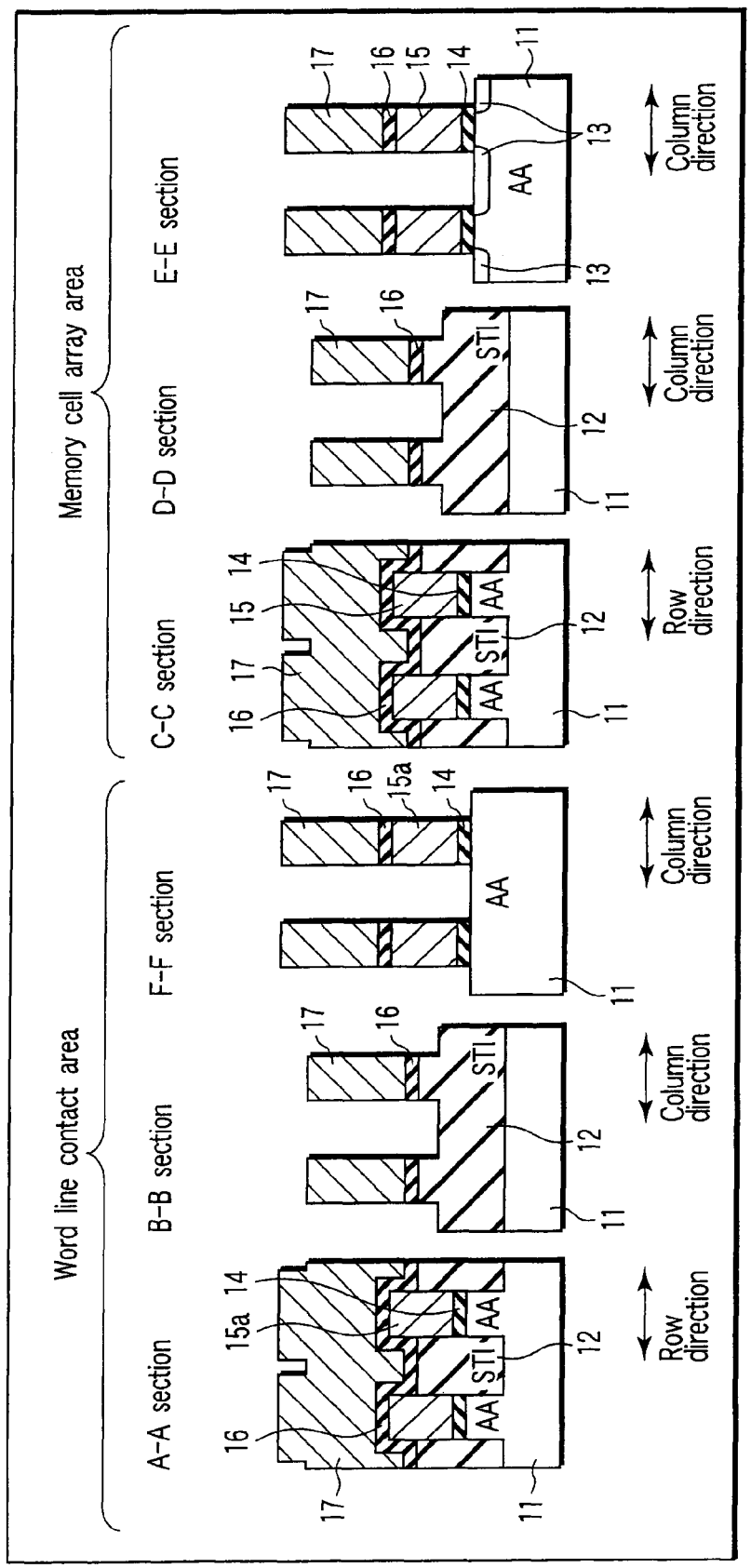
FIG. 20 is a cross sectional view showing one process of the manufacturing method.

As a result, as shown in FIG. 20, on the active area AA in the memory cell array area, the stack gate structure composed of the gate insulating film 14, the floating gate electrode 15, the inter-gate insulating film 16 and the conductive polysilicon film 17 of the control gate electrode is completed; on the active area AA in the word line contact area, the stack gate structure composed of the gate insulating film 14, the dummy gate electrode 15a, the inter-gate insulating film 16 and the conductive polysilicon film 17 of the control gate electrode is completed; and on the element isolation insulating layer 12, the structure composed of the inter-gate insulating film 16 and the conductive polysilicon film 17 of the control gate electrode is completed.

After that, the photoresist film is removed.

In addition, by using the ion implantation method, impurities are injected into the semiconductor substrate 11 in the memory cell array area in a self-aligning manner. Then, an annealing to activate the impurities is implemented, and the source/drain diffusion layer 13 is formed in the semiconductor substrate 11.

At this time, although the diffusion layer is formed also in the semiconductor substrate 11 in the word line contact area, if the bit line contact is not formed on the diffusion layer, a transistor formed in the word line contact area results in a dummy, so that the transistor does not actually operate.

Figure 21:
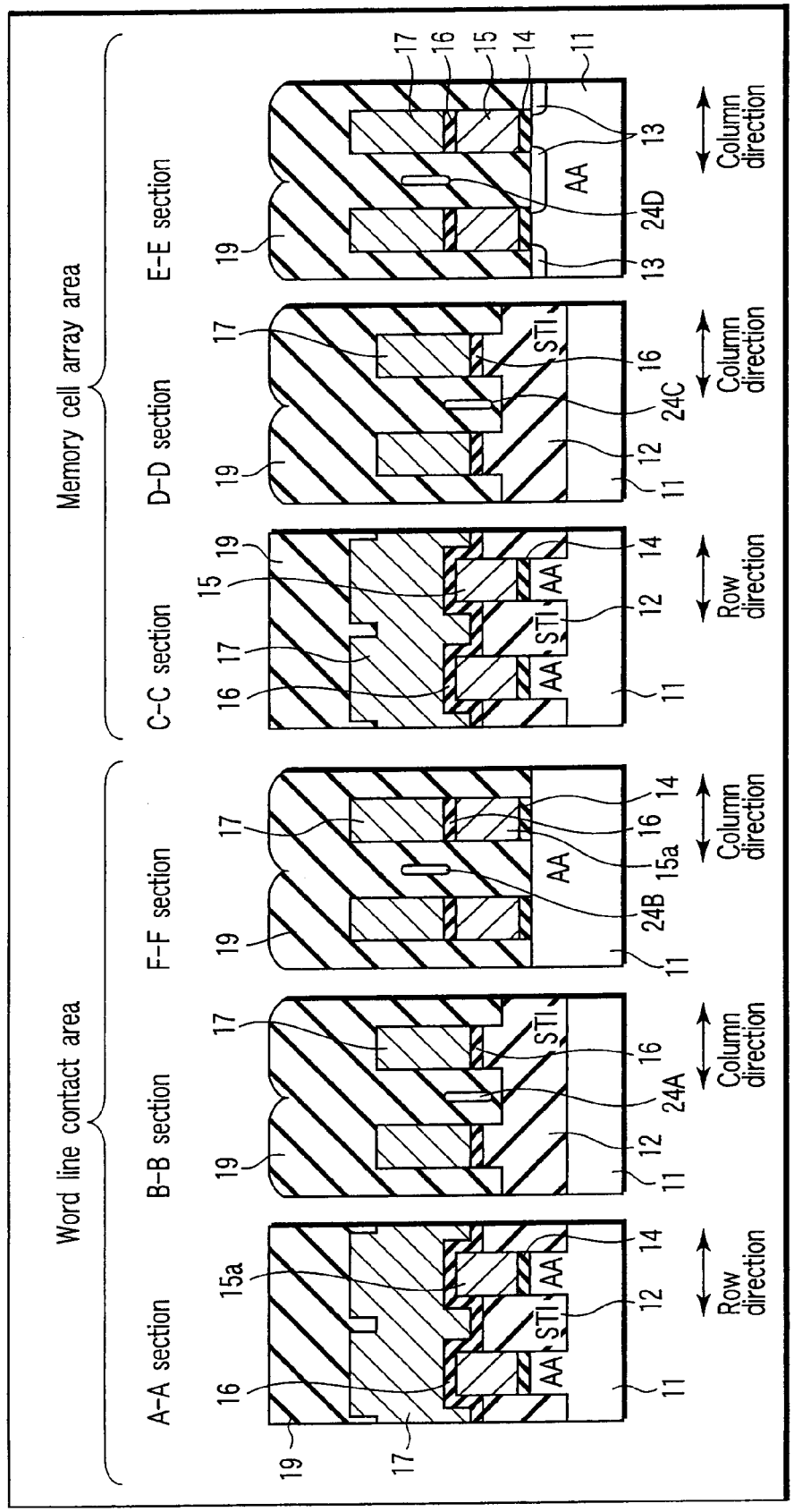
FIG. 21 is a cross sectional view showing one process of the manufacturing method.

Next, as shown in FIG. 21, by using the CVD method, by filling a space between the conductive polysilicon films 17 with the line & space structure, a TEOS oxide film, or the insulating film 19 formed of boron(B)-doped oxide film, phosphorous(P)-doped oxide film or the like is formed.

At this time, at a space between the control gate electrodes 17 in the word line contact area, the voids 24A and 24B are formed. In addition, at a space between the conductive polysilicon films 17 in the memory cell array area, the voids 24C and 24D are formed.

Here, the voids 24B and 24D on the active area AA are formed at the position higher than the voids 24A and 24C on the element isolation insulating layer 12.

Figure 22:
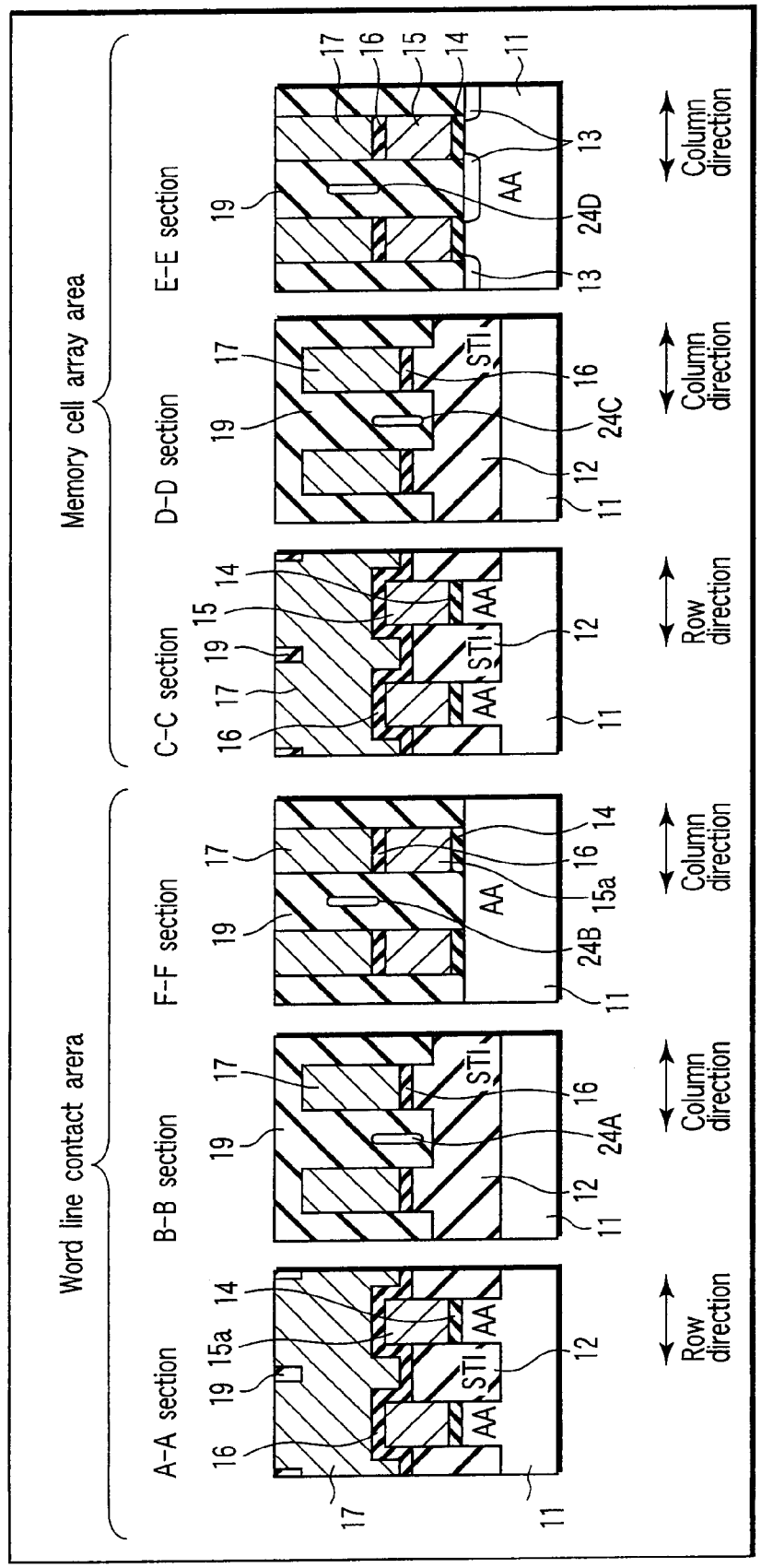
FIG. 22 is a cross sectional view showing one process of the manufacturing method.

Next, as shown in FIG. 22, by using the CMP method, the insulating film 19 is ground until the upper surface of the insulating film 19 coincides with the upper surface of the control gate electrode 17, or becomes slightly lower than the upper surface of the conductive polysilicon films 17.

Figure 23:
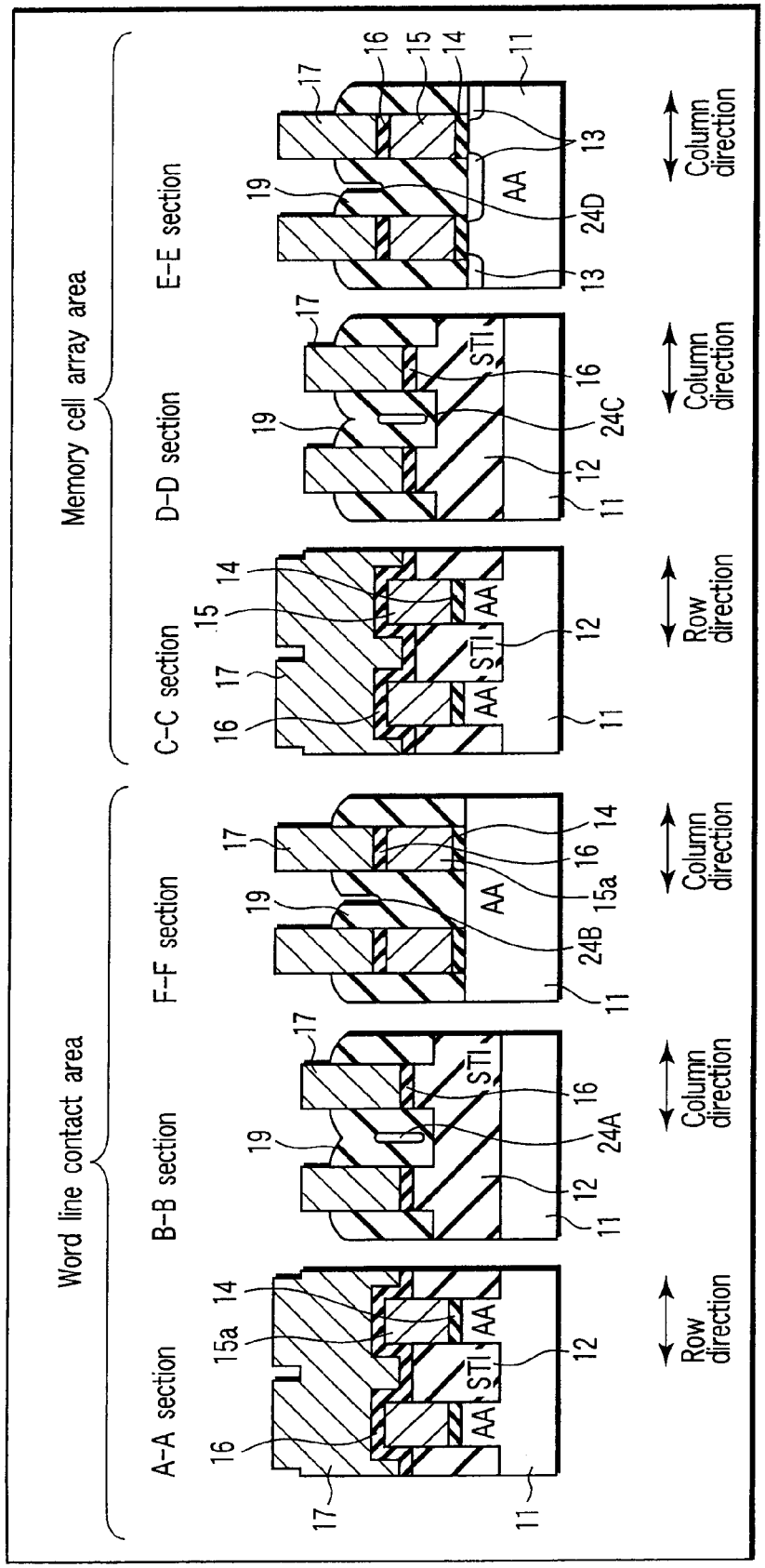
FIG. 23 is a cross sectional view showing one process of the manufacturing method.

Subsequently, as shown in FIG. 23, by using anisotropic dry etching, the insulating film 19 is etched. This etching is performed at least up to a point where the upper portions of the voids 24B and 24D on the active area AA are opened. By this etching, the insulating film 19 includes a recess at an upper portion thereof in the active area of the memory cell array area and the word line contact area.

In addition, in consideration of a silicide process described later, the highest portion of the insulating film 19 is set to a position lower than the upper surface of the conductive polysilicon films 17 and higher than the lower surface of the conductive polysilicon films 17.

Here, since the voids 24A and 24C on the element isolation insulating layer 12 are formed at positions lower than the voids 24B and 24D on the active area AA, the upper portions of the voids 24A and 24C are rarely opened by this etching.

Figure 24:
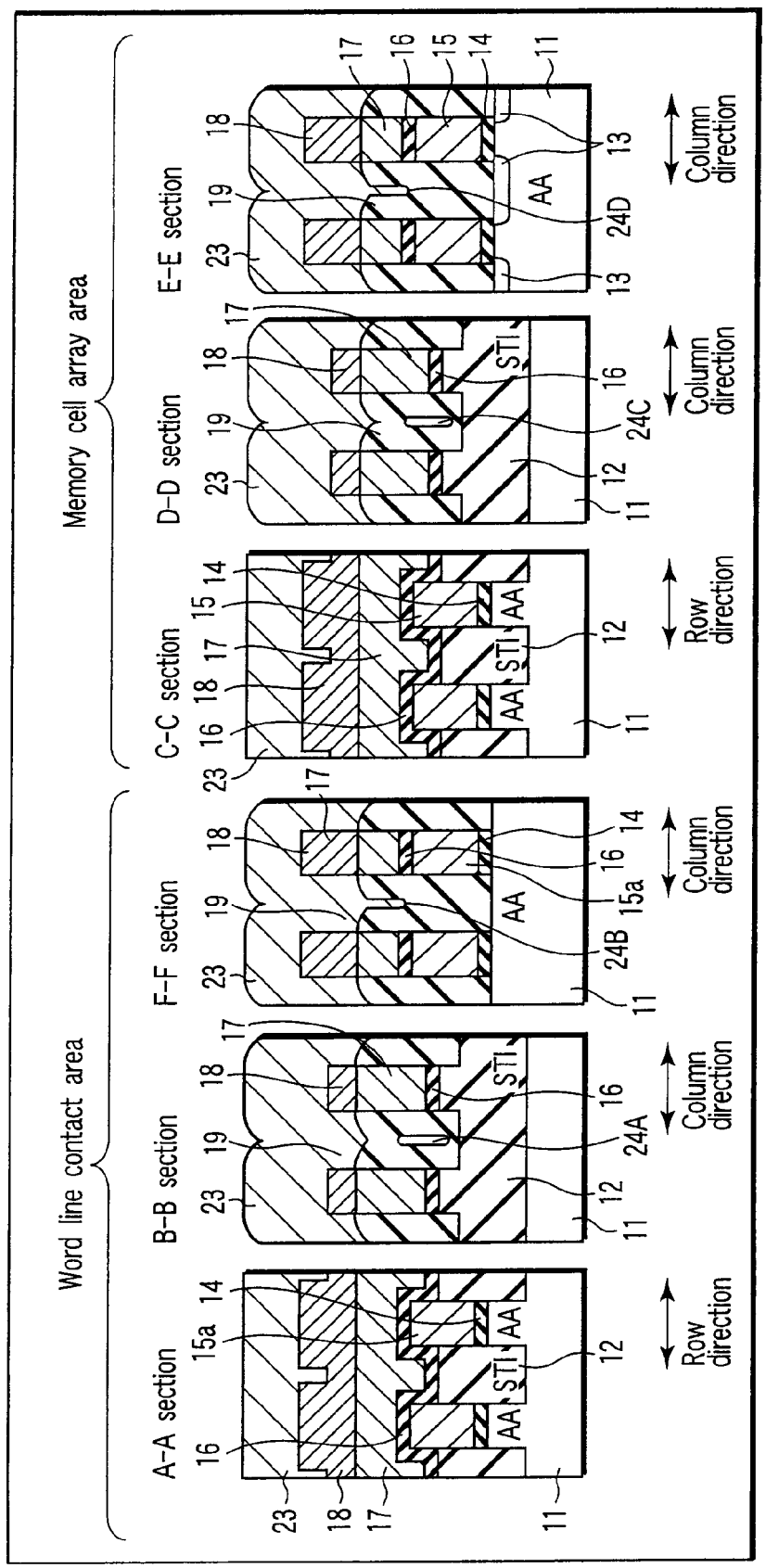
FIG. 24 is a cross sectional view showing one process of the manufacturing method.

Next, as shown in FIG. 24, on the conductive polysilicon film 17, the metal film 23 such as tungsten (W), cobalt (Co), nickel (Ni), titanium (Ti) or the like is formed. In addition, the metal silicide film (for instance, WSi, CoSi, NiSi, TiSi, or the like) 18 is formed in such a way that the upper portion of the conductive polysilicon films 17 and the metal film 23 are brought into a solid phase reaction while performing a heat treatment at a temperature of approximately 500° C. or more.

After that, by using a mixture of sulfuric acid and hydrogen peroxide solution, the unreacted metal film 23 is removed.

Here, since the highest portion of the insulating film 19 is set at a position higher than the lower surface of the control gate electrode 17, the control gate electrode results in the stack structure of the conductive polysilicon film 17 and the metal silicide film 18.

In addition, the lower surface of the metal silicide film 18 is formed at the same level to the highest portion of the insulating film 19 or at a position lower than the highest portion of the insulating film 19.

Meanwhile, when removing the unreacted metal film 23, the dissolved liquid of the metal silicide film 18 and the metal film 23 flows into the voids 24A, 24B, 24C and 24D. However, in the present invention, since the upper portions of the voids 24B and 24D are opened, the dissolved liquids does not remain in the voids 24A, 24B, 24C and 24D.

Figure 25:
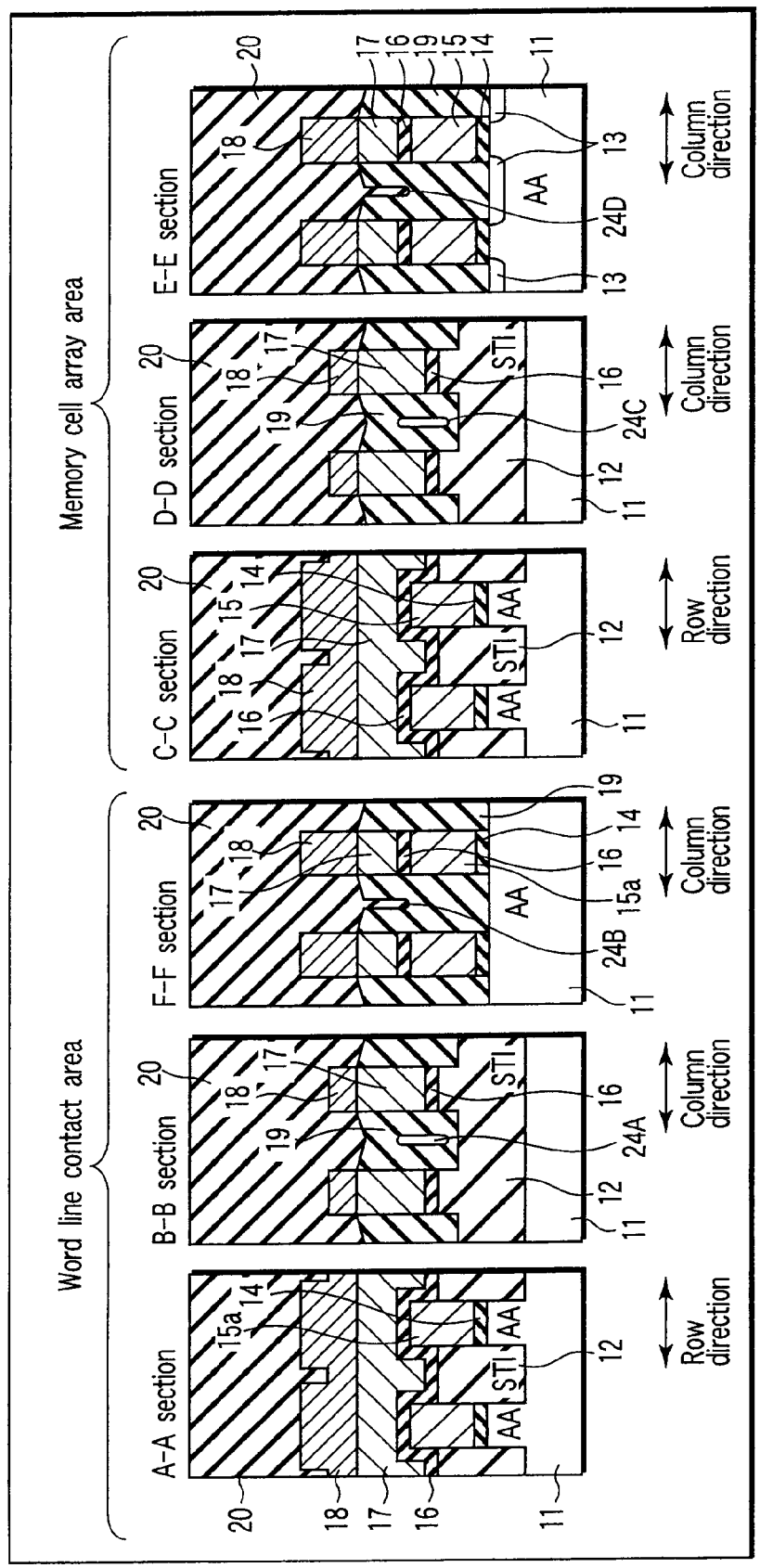
FIG. 25 is a cross sectional view showing one process of the manufacturing method.

Next, as shown in FIG. 25, by using the CVD method, by filling a space between the control gate electrodes with the line & space structure, a TEOS oxide film, or the insulating film 20 formed of boron(B)-doped oxide film, phosphorous (P)-doped oxide film or the like is formed.

At this time, since an aspect ratio (depth/width) of the space between the control gate electrodes becomes small, the void is not formed in the insulating film 20 between the control gate electrodes.

In addition, at this time, if the insulating film 20 fills the voids 24A, 243, 24C and 24D formed on the insulating film 19, the voids 24A, 24B, 24C and 24D disappear.

Further, when the insulating film 20 closes the openings of the voids 24A, 24B, 24C and 24D formed on the insulating film 19, complete voids 24A, 24B, 24C and 24D, are formed again.

In the present example, shown is the case where the voids 24B and 24B are filled with the insulating film 20, and the voids 24A and 24C remain.

Then, finally, as shown in FIG. 17, the contact hole CH coming into contact with the end area of the control gate electrodes (word line) is formed on the insulating film 20.

According to the above steps, the NAND type flash memory device of FIGS. 16 and 17 is completed.

D. Effect

As mentioned above, according to the second embodiment, in the word line contact area, the active area constituting the line & space structure is arranged just below the word line, up to the tip of the word line in the word line contact area from the boundary between the memory cell array area and the word line contact area, and thereby the dissolved liquid of the metal or the metal silicide does not remain at the space between the word lines.

In the second embodiment, as shown in FIG. 17, the void 24A and the void 24B are formed alternately on the insulating film 19 between the control gate electrodes (word line) in the word line contact area.

Figure 26:
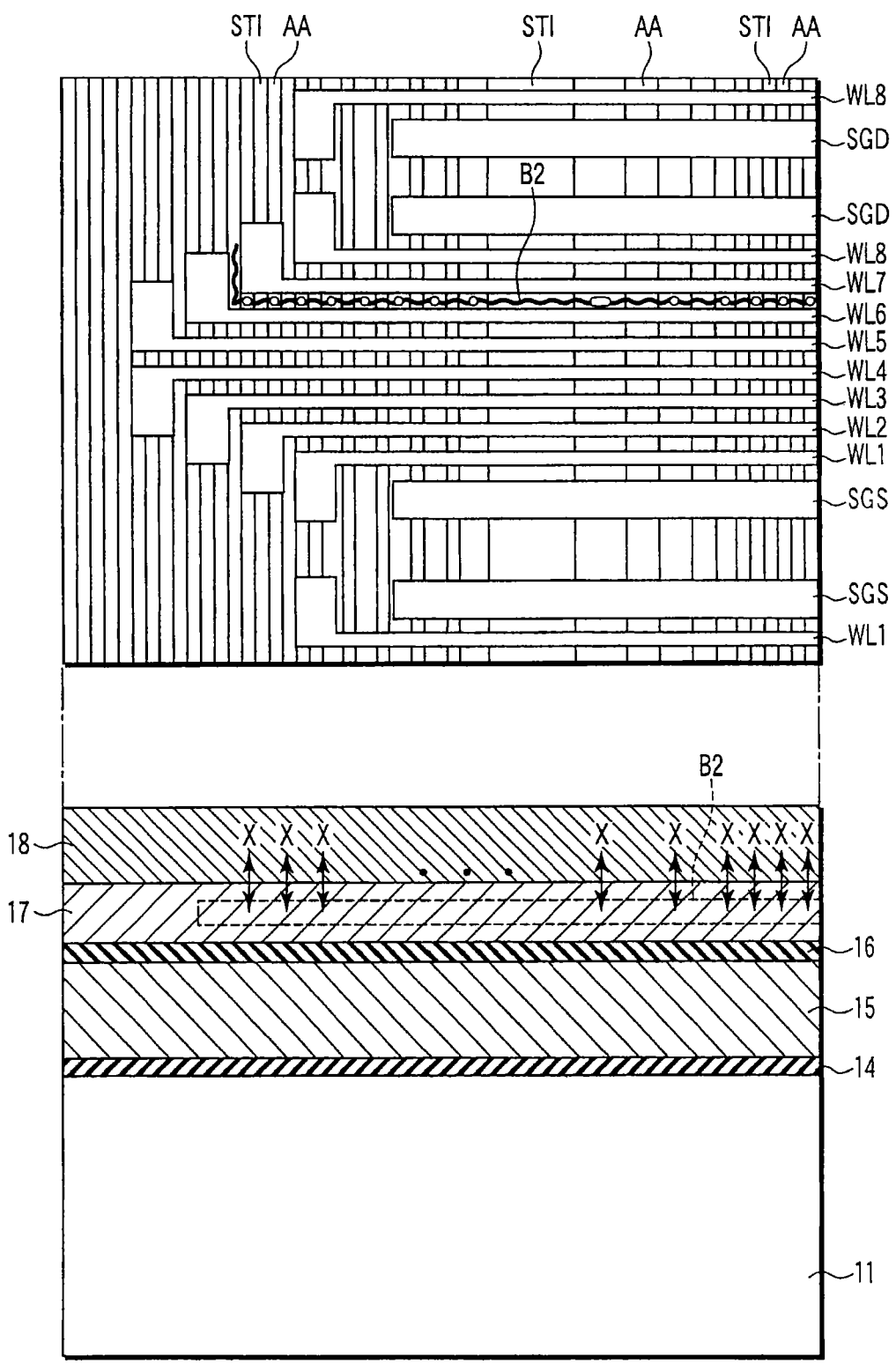
FIG. 26 is a view showing a model in which the dissolved liquid flows out of the void.

In this case, as shown in FIG. 26, even though, for instance, the dissolved liquid X of the metal silicide flows into the void B2 (24A and 24B) in the course of the manufacturing process, the dissolved liquid X flows out immediately, and thus does not remain in the void B2 (24A and 24B).

(3) Third Embodiment

The third embodiment is an application example of the first embodiment.

Figure 27:
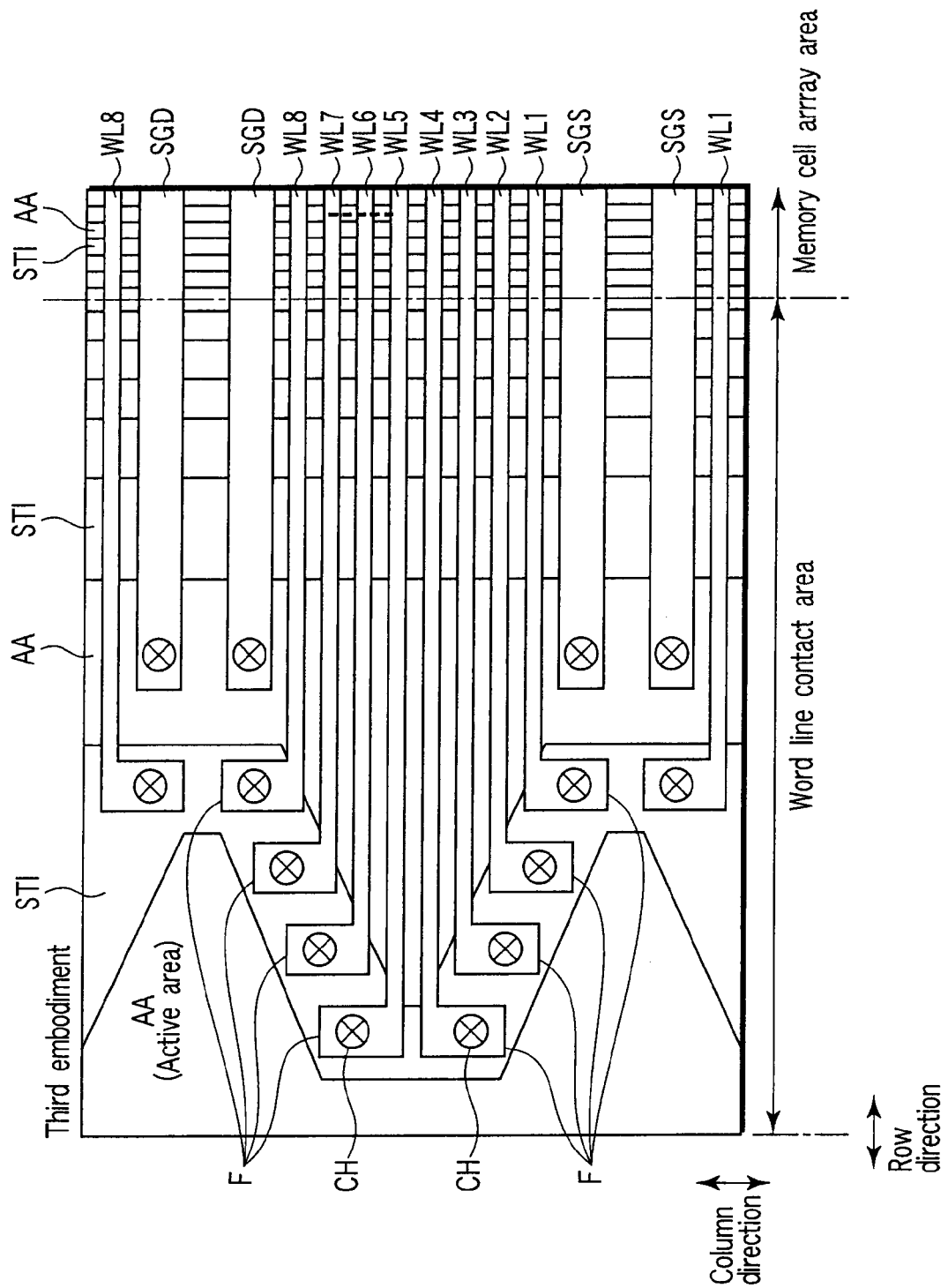
FIG. 27 is a plan view showing a layout of a third embodiment.

FIG. 27 shows a layout of an end area of the word line according to the third embodiment.

The third embodiment is different from the first embodiment in that the element isolation insulating layer STI is partially arranged just below the contact hole CH to the word lines WL1, . . . WL8.

In the present example, a fringe F is added to one end of the word lines WL1, ... WL8. However, the fringe F may be omitted.

The contact hole CH comes into contact with the fringe F. Just below the fringe F, when viewed from above the semiconductor substrate, the element isolation insulating layer STI is arranged to overlap with the fringe F.

In this case, even when the contact hole CH deviates from the fringe F due to the deviation of alignment in photolithography, since the base layer results in the element isolation insulating layer 12, there is no case in which the contact hole CH reaches the semiconductor substrate.

(4) Fourth Embodiment

The fourth embodiment is an application example of the first and second embodiments, and as shown in FIG. 1, the fourth embodiment is applied to the semiconductor memory device of the layout in which the word line contact area is arranged on only one side of the memory cell array area.

Figure 28:
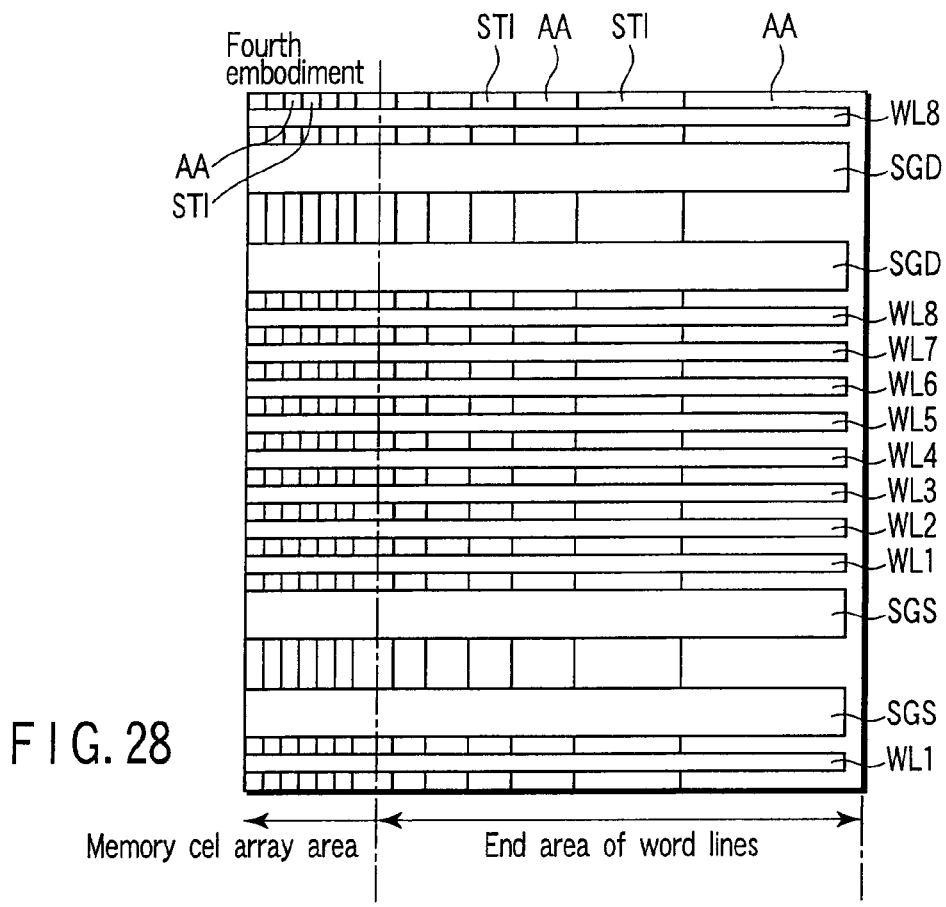
FIG. 28 is a plan view showing a layout of a fourth embodiment.

FIG. 28 shows a layout of an end area of the word line associated with the fourth embodiment.

A characteristic of the layout is that also at an end area of the word lines WL1, ... WL8 on the opposite side to the word line contact area, the active area AA is arranged.

The contact hole is not formed at the end area of the word lines WL1, ... WL8; however, the void is unavoidably formed at a space among the word lines WL1, ... WL8.

In this case, in the course of the manufacturing process, there is a risk that the dissolved liquid of the metal or the metal silicide flows into the void, and remains therein.

Accordingly, in the present example, the active area AA is also arranged at end areas of the word lines WL1, ... WL8 opposite to the word line contact area.

As the layout of the active area AA and the element isolation insulating layer STI, instead of the line & space as shown in the same drawing, it is possible to employ the layout in the first to third embodiments as it is.

(5) Others

Although the example of eight word lines has been described in the first to fourth embodiments, the number of the word lines is not limited to this example. In addition, the element isolation insulating layer is not limited to the STI structure.

The present invention is applicable to all semiconductor memories having a metal silicide structure-based word line.

In particular, the present invention is effective in a semiconductor memory device in which an interval between the word lines is narrow due to miniaturization, which thus means that voids are easily formed at a space between the word lines.

Specifically, it is possible to apply the present invention to the nonvolatile semiconductor memory device such as the NAND type flash memory device and the NOR type flash memory device, to a so-called 3-track NAND type flash memory device in which only one memory cell is arranged at a space between two select gate transistors, and further, to a so-called 2-track type flash memory device which is constituted from one select gate transistor and one memory cell, having both a NAND type property and a NOR type property.

The application of the present invention is not limited to the nonvolatile semiconductor memory device.

3. Application Example

There will be explained application examples of the present invention.

Figure 29:
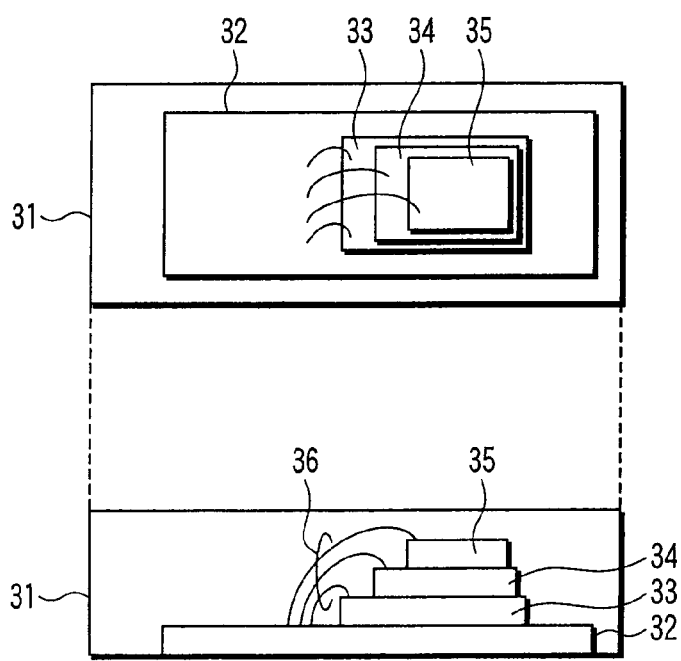
FIG. 29 is a view showing a memory device as an application example.

FIG. 29 shows an outline of a memory device.

The memory device is, for instance, a USB memory, a memory card or the like.

Within an envelope 31, a circuit substrate 32 is arranged. On a circuit substrate 32, a plurality of chips 33, 34 and 35 are stacked. The plurality of chips 33, 34 and 35 are connected to the circuit substrate 32 by a bonding wire 36.

Figure 30:
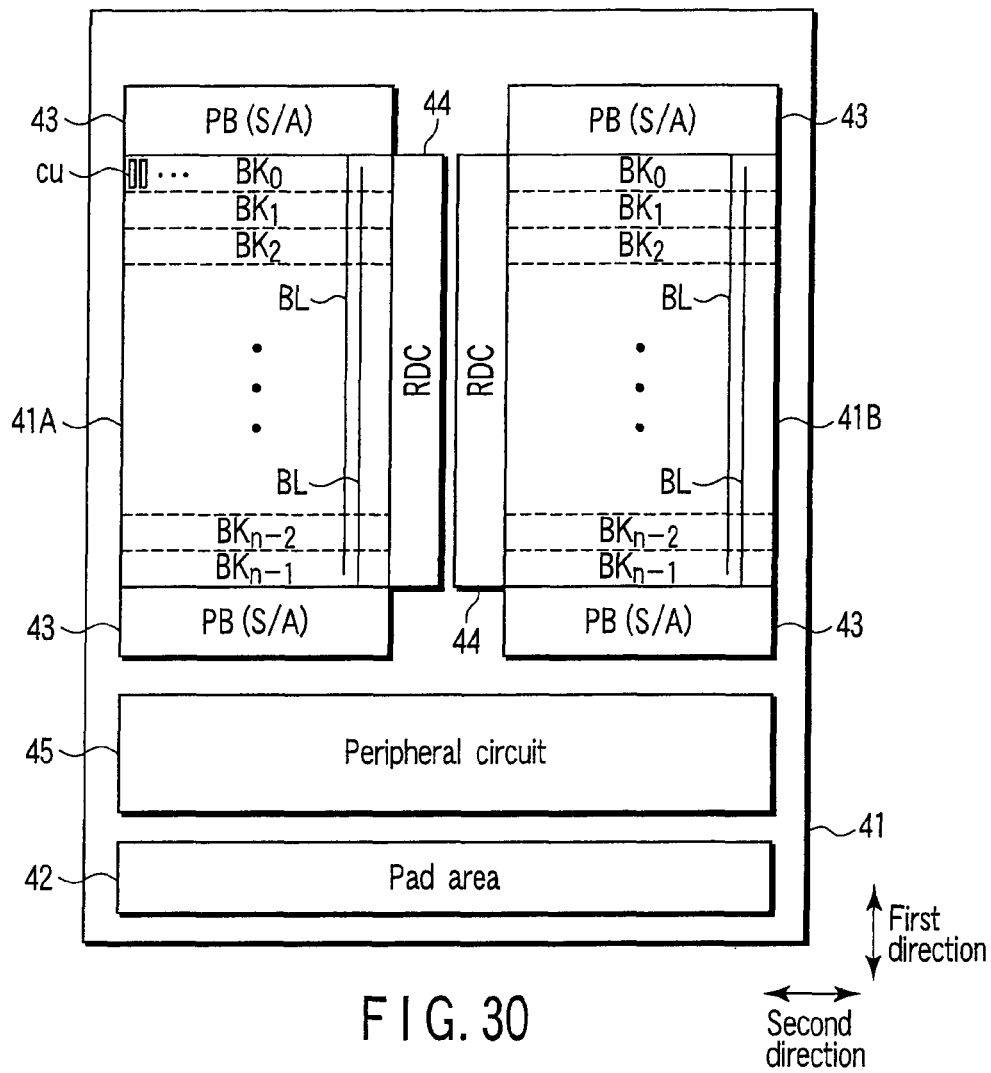
FIG. 30 is a view showing a layout of a memory chip.

At least one of the plurality of chips 33, 34 and 35 is the NAND type flash memory chip shown in FIG. 30.

A characteristic of the layout of the NAND type flash memory chip is that a pad area (power supply pad) 42 is arranged at one end side in the first direction of memory cell arrays 41A and 41B; and page buffers (sense amplifier) 43 are respectively arranged at one end side and the other end side in the first direction of the memory cell arrays 41A and 41B.

A row decoder 44 is arranged at one end side in the second direction of the memory cell arrays 41A and 41B. A peripheral circuit 45 is arranged at a space between the memory cell arrays 41A and 41B, and the pad area 42. The word line contact area in the present invention is arranged at a space between the memory cell arrays 41A and 41B, and the row decoder 44.

Figure 31:
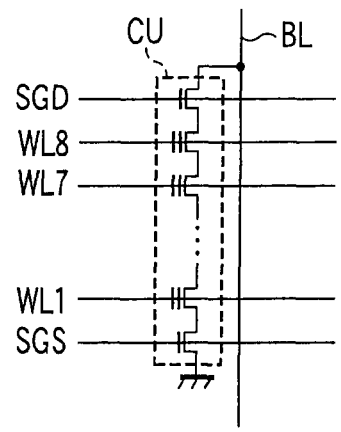
FIG. 31 is a view showing a cell unit.

The memory cell arrays 41A and 41B are constituted from a plurality of blocks $BK_0, \ldots BK_{n-1}$, and the plurality of blocks $BK_0, \ldots BK_{n-1}$, have a NAND cell unit CU, as shown in FIG. 31. The bit line BL extends in the first direction; and the word lines WL1, ... WL8 and the select gate lines SGS and SGD extend in the second direction.

Such a layout is used in the case of employing an ABL (All Bit Line) sense amplifier architecture capable of sensing all bit lines BL simultaneously; or in the case of mitigating a layout pitch in a sense amplifier architecture of a bit line shield system.

4. Conclusion

According to the present invention, the dissolved liquid of the metal silicide does not remain at a space between the word lines.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device, comprising:
a semiconductor substrate including a first region and a second region located adjacent to the first region,
the first region including a first active area sectionalized by a first element isolation area extending to a first direction,
the second region including second active areas sectionalized by second element isolation areas extending to the first direction;
first and second word lines extending from the first region to the second region and connecting to memory cells, said first and second word lines located parallel to each other and extending to a second direction perpendicular to the first direction
a first insulating film provided between the first and second word lines and directly contacting to one side of the first word line and contacting to one side of the second word line, and the first insulating film including a void; and
first and second contacts provided respectively corresponding to the first and second word lines in the second region,
wherein a first bottom portion of the void on one of the second active areas is higher than a second bottom portion of the void on the second element isolation area.

2. The semiconductor memory device according to claim 1, wherein the first and second word lines include a polysilicon film and a metal silicide film formed on the polysilicon film.

3. The semiconductor memory device according to claim 2, wherein the metal silicide film is constituted from one material selected from the group consisting of WSi, CoSi, NiSi and TiSi.

4. The semiconductor memory device according to claim 1, wherein each of the memory cells includes a charge accumulation layer and an inter-gate insulating film provided on the charge accumulation layer, and a top of the void is higher than an inter-gate insulating film on the first active area.

5. The semiconductor memory device according to claim 4, wherein in the first active area, a top of the void is closed by the first insulating film.

6. The semiconductor memory device according to claim 1, wherein in one of the second active areas, the void includes an opening at an upper portion, and the opening of the void is closed by a second insulating film.

7. The semiconductor memory device according to claim 1, wherein in the first active area, a top of the void is closed by the first insulating film.

8. The semiconductor memory device according to claim 1, wherein a width of one of the second active areas is wider than a width of the first active area.

* * * * *